(12) United States Patent
Ichikawa et al.

(10) Patent No.: US 11,133,489 B2
(45) Date of Patent: Sep. 28, 2021

(54) DISPLAY DEVICE, METHOD OF MANUFACTURING DISPLAY DEVICE, AND ELECTRONIC DEVICE

(71) Applicant: Sony Corporation, Tokyo (JP)

(72) Inventors: Tomoyoshi Ichikawa, Kanagawa (JP); Hiroshi Fujimaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/432,152

(22) Filed: Jun. 5, 2019

(65) Prior Publication Data

US 2019/0288239 A1    Sep. 19, 2019

Related U.S. Application Data

(63) Continuation of application No. 15/558,812, filed as application No. PCT/JP2016/054922 on Feb. 19, 2016.

(30) Foreign Application Priority Data

Apr. 1, 2015    (JP) ............................. JP2015-074982

(51) Int. Cl.
*H01L 51/52*    (2006.01)
*H01L 51/50*    (2006.01)
(Continued)

(52) U.S. Cl.
CPC ........ *H01L 51/5265* (2013.01); *H01L 27/322* (2013.01); *H01L 27/3244* (2013.01);
(Continued)

(58) Field of Classification Search
None
See application file for complete search history.

(56) References Cited

U.S. PATENT DOCUMENTS 6,200,695 B1    3/2001  Arai et al.
2007/0269621 A1*  11/2007  Mitsuhashi ......... H01L 51/0003
428/34.1
(Continued)

FOREIGN PATENT DOCUMENTS

JP    2000-100573 A    4/2000
JP    2006-278257 A    10/2006
(Continued)

OTHER PUBLICATIONS

U.S. Office Action dated Mar. 31, 2020 for related U.S. Appl. No. 15/558,812.

*Primary Examiner* — Erik Kielin
(74) *Attorney, Agent, or Firm* — Michael Best & Friedrich LLP

(57) ABSTRACT

A display device according to the present disclosure includes a first electrode, an inorganic hole injecting and transporting layer which is formed of an inorganic material and is formed on the first electrode, at least two light emitting units including a first organic light emitting unit and a second organic light emitting unit having different luminescent colors which are formed on the inorganic hole injecting and transporting layer, an electron transport layer which is formed on the at least two organic light emitting units, and a second electrode which is formed on the electron transport layer. Furthermore, a light emitting layer of the first organic light emitting unit is formed by laminating a light emitting layer of a first luminescent color and a light emitting layer of a second luminescent color, and a light emitting layer of the second organic light emitting unit is formed of the light emitting layer of the second luminescent color.

10 Claims, 21 Drawing Sheets

(51) Int. Cl.
 *H01L 27/32* (2006.01)
 *H01L 51/56* (2006.01)
(52) U.S. Cl.
 CPC ........ *H01L 51/504* (2013.01); *H01L 51/5044* (2013.01); *H01L 51/5056* (2013.01); *H01L 51/5072* (2013.01); *H01L 51/5088* (2013.01); *H01L 51/5218* (2013.01); *H01L 51/5234* (2013.01); *H01L 51/5281* (2013.01); *H01L 51/56* (2013.01); *H01L 2251/558* (2013.01)

(56) References Cited

U.S. PATENT DOCUMENTS

| | | | |
|---|---|---|---|
| 2009/0263924 A1 | 10/2009 | Lee | |
| 2010/0133994 A1 | 6/2010 | Song et al. | |
| 2011/0037065 A1* | 2/2011 | Ueno | H01L 51/009 |
| | | | 257/40 |
| 2012/0097933 A1* | 4/2012 | Ando | H01L 27/3218 |
| | | | 257/40 |
| 2012/0223633 A1* | 9/2012 | Yoshinaga | H01L 51/50 |
| | | | 313/504 |
| 2013/0153883 A1 | 6/2013 | Kurata et al. | |
| 2016/0093678 A1 | 3/2016 | Seo et al. | |

FOREIGN PATENT DOCUMENTS

| | | |
|---|---|---|
| JP | 2011-155004 A | 8/2011 |
| WO | WO-2011/004421 A1 | 1/2011 |
| WO | 2014/020811 A1 | 2/2014 |

* cited by examiner

DISPLAY DEVICE, METHOD OF MANUFACTURING DISPLAY DEVICE, AND ELECTRONIC DEVICE

CROSS REFERENCES TO RELATED APPLICATIONS

This is a Continuation Application of U.S. patent application Ser. No. 15/558,812, filed Sep. 15, 2017, which is a National Stage Entry of Application No.: PCT/JP2016/054922, filed Feb. 19, 2016, which claims priority to Japanese Patent Application No.: 2015-074982, filed Apr. 1, 2015, the entire contents of which being incorporated herein by reference.

TECHNICAL FIELD

The present disclosure relates to a display device, a method of manufacturing a display device, and an electronic device.

BACKGROUND ART

An organic electro luminescence (EL) display device displays an image by using the EL of an organic material. Furthermore, in recent years, the technology of the organic EL display device has been applied to an ultra-small display (that is, micro display) requiring a fine pixel pitch of about several microns in addition to a direct view type display such as a monitor.

As a method of realizing full color, the organic EL display device has two methods, i.e., a method of painting a plurality of colors, for example, three primary colors of red (R), green (G), and blue (B), organic EL materials by evaporation by using a mask and a method for combining a white (W) light emitting organic EL element with color filters. The white light emitting organic EL element (white organic EL element) has a structure that extracts white light by laminating, for example, light emitting layers of three colors R, G, and B over all the pixels.

In these methods, the RGB coloring method is used in the direct view type organic EL display device in general. For a fine pixel pitch of about several microns such as an ultra-small display, from the viewpoint of mask alignment accuracy and the like, it is difficult to employ the RGB coloring method as the method for realizing the full color and realize coloring by mask vapor deposition process. Therefore, in the organic EL display device having the fine pixel pitch of about several microns, the method of combining the white organic EL element which extracts white light by laminating the light emitting layers of three colors of R, G, and B and the color filters is applied as the method of realizing full color.

However, in the method of combining the white organic EL element and the color filters, since the white light emitted from the white organic EL element is decomposed by the color filter, a loss is large. Also, a luminous efficiency becomes lower than that of the RGB coloring method. Whereas, a technology has been known in which high luminous efficiency and improvement in color reproducibility are realized by employing a resonator structure which emphasizing light with a specific wavelength by a resonance effect (for example, refer to Patent Document 1).

CITATION LIST

Patent Document

Patent Document 1: Japanese Patent Application Laid-Open No. 2006-278257

SUMMARY OF THE INVENTION

Problems to be Solved by the Invention

In the resonator structure, a microcavity structure is formed by making optical path length between a reflective film and a transparent electrode be different for each color of R, G, and B, and the light having the specific wavelength is emphasized by the resonance effect. In Patent Document 1, the optical path length between the reflective film and the transparent electrode has been adjusted by controlling the film thickness of an interlayer film between the reflective film and the transparent electrode. The film thickness of the interlayer film between the reflective film and the transparent electrode is controlled by sputtering or a chemical vapor deposition (CVD) process. However, when the film thickness is controlled by sputtering and the CVD process, it is more difficult to accurately control the film thickness than a case where the film thickness is controlled by a vapor deposition process, and the film thickness easily varies. Then, when the film thicknesses varies, the optical path length between the reflective film and the transparent electrode, that is, the optical path length of the resonator structure varies for each color. Therefore, variations in color and luminous efficiency are generated.

A purpose of the present disclosure is to provide a display device, a method of manufacturing a display device, and an electronic device including the display device which can reduce variations in color and luminous efficiency by controlling an optical path length of a resonator structure with high accuracy.

Solutions to Problems

A display device according to the present disclosure to achieve the above purpose includes:

a first electrode;

an inorganic hole injecting and transporting layer which is formed of an inorganic material and is formed on the first electrode;

at least two light emitting units including a first organic light emitting unit and a second organic light emitting unit respectively having different luminescent colors which are formed on the inorganic hole injecting and transporting layer;

an electron transport layer which is formed on the at least two organic light emitting units; and a second electrode which is formed on the electron transport layer.

A light emitting layer of the first organic light emitting unit is formed by laminating a light emitting layer of a first luminescent color, and a light emitting layer of a second luminescent color, and a light emitting layer of the second organic light emitting unit is formed of the light emitting layer of the second luminescent color.

Furthermore, a method of manufacturing a display device according to the present disclosure to achieve the above purpose includes:

forming an inorganic hole injecting and transporting layer formed of an inorganic material on a first electrode;

forming at least two light emitting units including a first organic light emitting unit formed by laminating a light emitting layer of a first luminescent color and a light emitting layer of a second luminescent color and a second organic light emitting unit formed of the light emitting layer of the second luminescent color on the inorganic hole injecting and transporting layer;

forming an electron transport layer on the at least two organic light emitting units; and forming a second electrode on the electron transport layer.

After the light emitting layer of the first luminescent color is formed on the inorganic hole injecting and transporting layer, the light emitting layer of the first luminescent color in a region of the second organic light emitting unit on the inorganic hole injecting and transporting layer is removed by being irradiated with energy beams, and then, the light emitting layer of the second luminescent color is formed in the region of the first organic light emitting unit and the region of the second organic light emitting unit.

Furthermore, an electronic device of the display device according to the present disclosure to achieve the above purpose includes the display device having the above-described configuration.

In the display device having the above configuration, the method of manufacturing the display device, or the electronic device, the inorganic material forming the hole injecting and transporting layer has a much lower etching rate than the organic material, in other words, the inorganic material is more hardly etched than the organic material. Therefore, since the inorganic hole injecting and transporting layer is provided on the first electrode, the film thickness of the organic layer (organic light emitting unit) can be controlled by the vapor deposition process without using a mask. Furthermore, with the film thickness control of the organic layer by the vapor deposition process, since the film thickness can be controlled with higher accuracy than the film thickness control by the sputtering or the CVD process, the optical path length of the resonator structure can be controlled with high accuracy.

Effects of the Invention

According to the present disclosure, since an optical path length of a resonator structure can be controlled with high accuracy, variations in color and luminous efficiency can be reduced.

Furthermore, the effects are not limited to the above, and the effect may be any effects described herein. Furthermore, the effects described herein are only exemplary, and the effect of the present disclosure is not limited to these. Also, there may be an additional effect.

BRIEF DESCRIPTION OF DRAWINGS

FIG. 20A is a front view of the digital still camera, and FIG. 20B is a rear view.

MODE FOR CARRYING OUT THE INVENTION

Figure 1:
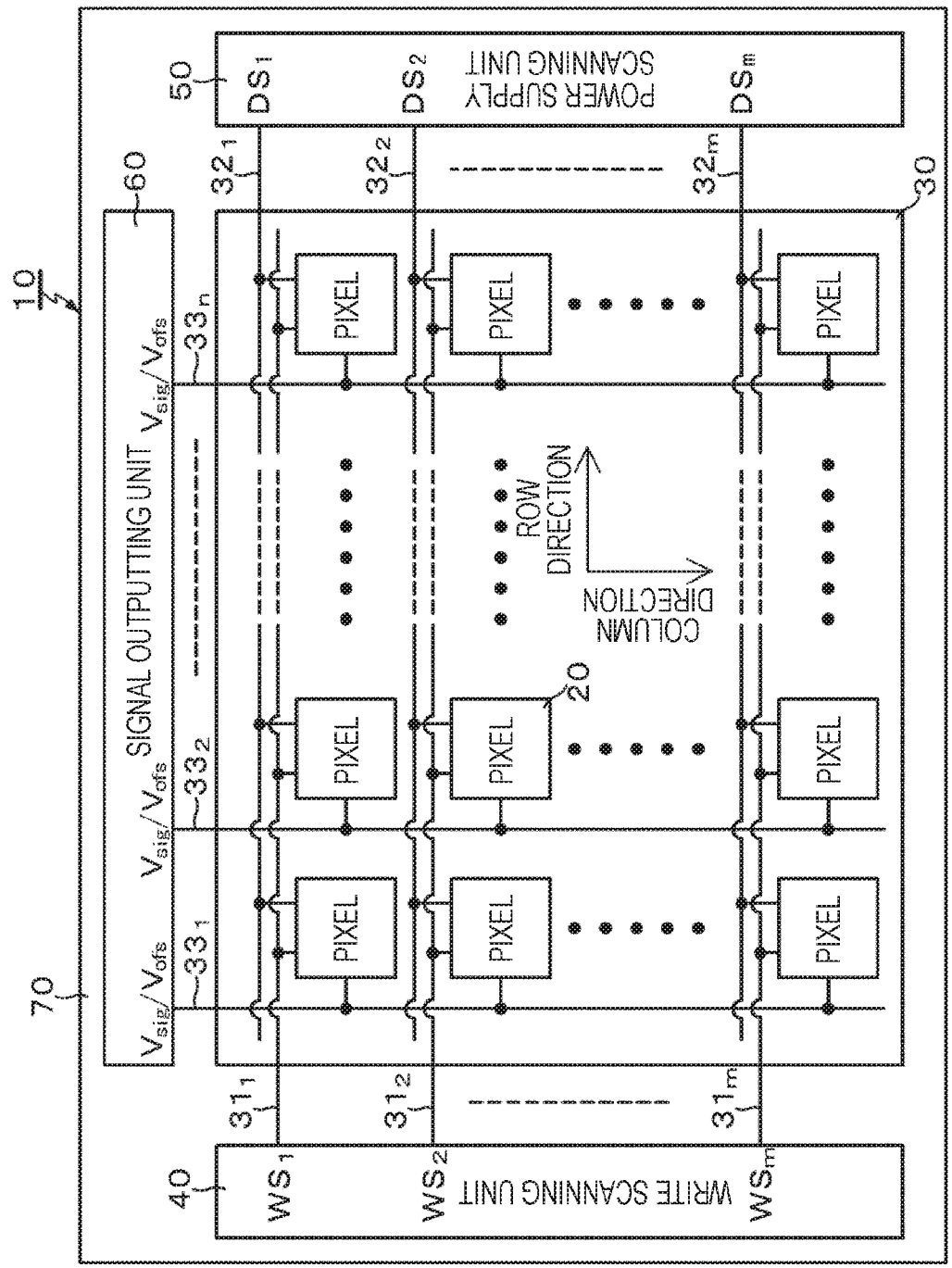
FIG. 1 is a system configuration diagram of a basic schematic configuration of an active matrix type organic EL display device to be a premise of the present disclosure.

Embodiments for carrying out the technology according to the present disclosure (referred to as "embodiments" below) are described in detail with reference to the drawings. The technology of the present disclosure is not limited to the embodiments, and various values and materials in the embodiments are only exemplary. In the following description, the same elements or the elements having the same functions are denoted with the same reference numerals, and overlapped description is omitted. Note that the description is made in the following order.

1. General description on display device, method of manufacturing display device, and electronic device according to the present disclosure
2. Display device as the premise of the present disclosure
2-1. System configuration
2-2. Pixel circuit
2-3. Method of realizing full color
2-4. Resonator structure
3. One embodiment of the present disclosure
3-1. First embodiment
3-2. Second embodiment (example having optical path length adjusting layer)
3-3. Third embodiment (example in which inorganic hole injecting and transporting layer is electrically isolated in units of pixels)
3-4. Fourth embodiment (example in which partition walls are provided at both ends of red organic EL element)
4. Electronic device General Description on Display Device, Method of Manufacturing Display Device, and Electronic Device According to the Present Disclosure In a display device, a method of manufacturing the display device, and an electronic device according to the present disclosure, three light emitting units can be included, i.e., a first organic light emitting unit, a second organic light emitting unit, and a third organic light emitting unit. Furthermore, a light emitting layer of the first organic light emitting unit is formed by laminating a light emitting layer of a first luminescent color, a light emitting layer of a second luminescent color, and a light emitting layer of a third luminescent color. A light emitting layer of the second organic light emitting unit is formed by laminating the light emitting layer of the second luminescent color and the light emitting layer of the third luminescent color. A light emitting layer of the third organic light emitting unit is formed of the light emitting layer of the third luminescent color. This configuration can be used.

In the display device, the method of manufacturing the display device, and the electronic device according to the present disclosure including the preferable configuration described above, the first organic light emitting unit can include an optical path length adjusting layer provided between an inorganic hole injecting and transporting layer and the light emitting layer of the first luminescent color. Furthermore, the inorganic hole injecting and transporting layer can have a configuration in which the light emitting layers of the first luminescent color and the second luminescent color are separated by an insulating film. Furthermore, the first organic light emitting unit can have partition walls provided between adjacent organic light emitting units.

In addition, in the method of manufacturing the display device according to the present disclosure including the preferable configuration described above, an energy beam can be anyone of a laser beam, an electron beam, a molecular beam, and an ion beam. Furthermore, the surface of the inorganic hole injecting and transporting layer can be irradiated with the energy beams from an oblique direction.

Display Device as the Premise of the Present Disclosure

System Configuration

FIG. 1 is a system configuration diagram of a basic schematic configuration of an active matrix type organic EL display device to be a premise of the present disclosure.

The active matrix type display device is a display device in which a light emitting unit (light emitting element) is driven by an active element provided in the same pixel as the light emitting unit, for example, an insulation gate type field effect transistor. Typically, a thin film transistor (TFT) can be used as the insulation gate type field effect transistor.

Here, as an example, a case of an active matrix type organic EL display device in which a light emitting unit (light emitting element) of a unit pixel (pixel circuit) is formed of an organic EL element is described. The organic EL element is a current driven type electrooptical element in which a light emission luminance changes according to a value of a current flowing in a device. The "unit pixel/pixel circuit" may be simply described as a "pixel".

As illustrated in FIG. 1, an active matrix type organic EL display device 10 to be a premise of the present disclosure includes a pixel array unit 30 and a driving unit (peripheral circuit) which is arranged in a peripheral region of the pixel array unit 30 and drives the pixel 20. In the pixel array unit 30, the plurality of unit pixels 20 is two-dimensionally arranged in a matrix (two-dimensional matrix). The driving unit includes, for example, a write scanning unit 40, a power supply scanning unit 50, and a signal outputting unit 60 and drives each pixel 20 of the pixel array unit 30.

In this example, the write scanning unit 40, the power supply scanning unit 50, and the signal outputting unit 60 are mounted on the same substrate as the pixel array unit 30, that is, on a display panel 70, as peripheral circuits of the pixel array unit 30. However, a configuration can be employed in which some or all the write scanning unit 40, the power supply scanning unit 50, and the signal outputting unit 60 are provided outside the display panel 70. Furthermore, although the write scanning unit 40 and the power supply scanning unit 50 are arranged on one side of the pixel array unit 30, the pixel array unit 30 may be arranged between the write scanning unit 40 and the power supply scanning unit 50. As the substrate of the display panel 70, a transparent insulating substrate such as a glass substrate can be used. Also, a semiconductor substrate such as a silicon substrate can be used.

In the full-color-compatible organic EL display device 10, a single pixel (unit pixel/pixel) to be a unit when a color image is formed includes sub-pixels of plural colors. At this time, each of the sub-pixels corresponds to the pixel 20 in FIG. 1. More specifically, in the full-color-compatible display device, the single pixel includes, for example, three sub-pixels, i.e., a sub-pixel for emitting red (R) light, a sub-pixel for emitting green (G) light, and a sub-pixel for emitting blue (B) light.

However, the single pixel is not limited to be a combination of the sub-pixels of three primary colors of RGB, and the single pixel can be configured by further adding one or a plurality of sub-pixels to the three primary color sub-pixels. More specifically, for example, a single pixel can be formed by adding a sub-pixel for emitting white (W) light to improve a luminance. Also, a single pixel can be formed by adding at least one sub-pixel for emitting complementary color light to extend a color reproduction range.

In the pixel array unit 30, scanning lines 31 ($31_1$ to $31_m$) and power supply lines 32 ($32_1$ to $32_m$) are arranged along the row direction (arrangement direction of pixels of the pixel row/horizontal direction) with respect to the arrangement of the pixels 20 of m rows and n columns for each pixel row. In addition, signal lines 33 ($33_1$ to $33_n$) are provided for each pixel column along a column direction (arrangement direction of pixels in pixel column/vertical direction) relative to the arrangement of the pixels 20 of m rows and n columns.

The scanning lines $31_1$ to $31_m$ are respectively connected to output ends of the corresponding rows of the write scanning unit 40. The power supply lines $32_1$ to $32_m$ are respectively connected to output ends of the corresponding rows of the power supply scanning unit 50. The signal lines $33_1$ to $33_n$ are respectively connected to output ends of the corresponding columns of the signal outputting unit 60.

The write scanning unit 40 includes a shift register circuit and the like. When writing a signal voltage of a video signal to each pixel 20 of the pixel array unit 30, the write scanning unit 40 sequentially supplies write scanning signals WS ($WS_1$ to $WS_m$) to the scanning lines 31 ($31_1$ to $31_m$) so as to sequentially scan each pixel 20 of the pixel array unit 30 row by row, that is, to perform line sequential scanning.

Similar to the write scanning unit 40, the power supply scanning unit 50 includes a shift register circuit and the like. In synchronization with the line sequential scanning by the write scanning unit 40, the power supply scanning unit 50 supplies power supply voltages DS ($DS_1$ to $DS_m$) respectively to the power supply lines 32 ($32_1$ to $32_m$). The power supply voltages DS can be switched between a first power supply voltage $V_{ccp}$ and a second power supply voltage $V_{ini}$ lower than the first power supply voltage $V_{ccp}$. As described later, emission/non-emission (quenching) of the pixel 20 is controlled by switching the $V_{ccp}/V_{ini}$ of the power supply voltage DS.

The signal outputting unit 60 selectively outputs a signal voltage $V_{sig}$ of the video signal corresponding to luminance information (may be simply referred to as "signal voltage" below) and a reference voltage $V_{ofs}$ which are supplied from a signal supply source (not shown). Here, the reference voltage $V_{ofs}$ is a voltage to be the reference of the signal voltage $V_{sig}$ of the video signal (for example, voltage corresponding to black level of video signal), and is used for threshold correction processing to be described later.

The signal voltage $V_{sig}$/the reference voltage $V_{ofs}$ output from the signal outputting unit 60 is written to each pixel 20 of the pixel array unit 30 via the signal lines 33 ($33_1$ to $33_n$) in units of the pixel rows selected by the scanning by the write scanning circuit 40. That is, the signal outputting unit 60 employs a line-sequential write driving mode in which the signal voltage $V_{sig}$ is written in units of rows (lines).

Pixel Circuit

Figure 2:
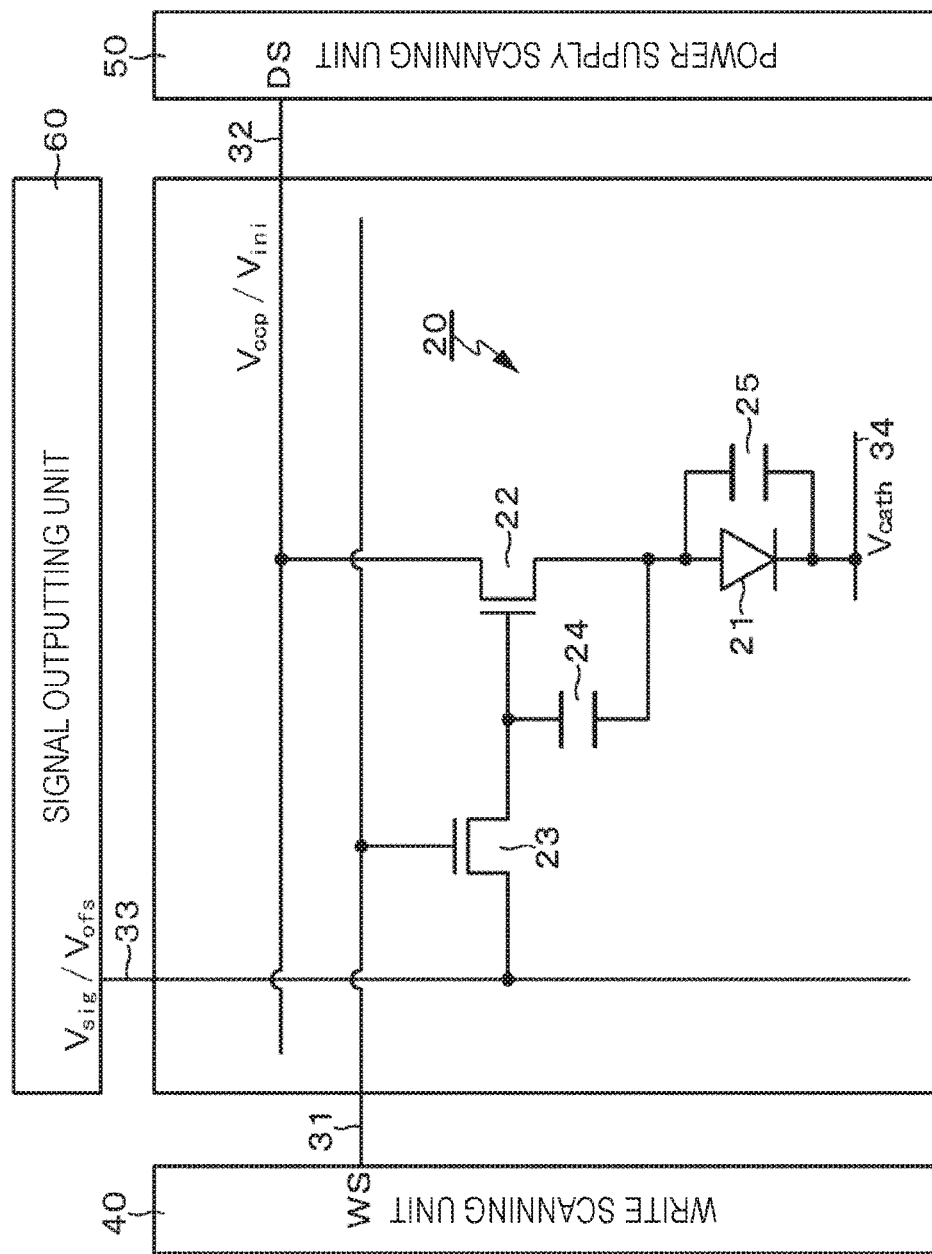
FIG. 2 is a circuit diagram of a circuit configuration of a 2Tr2C unit pixel (pixel circuit).

FIG. 2 is a circuit diagram of an example of a specific circuit configuration of the unit pixel (pixel circuit) 20. The light emitting unit of the pixel 20 is formed of an organic EL element 21 which is an exemplary current driving type electrooptical element in which the light emission luminance changes according to the value of the current flowing in the device.

As illustrated in FIG. 2, the pixel 20 includes the organic EL element 21 and a drive circuit for driving the organic EL element 21 by applying a current to the organic EL element 21. In the organic EL element 21, a cathode electrode is connected to a common power supply line 34 arranged for all the pixels 20 in common.

The drive circuit for driving the organic EL element 21 includes a driving transistor 22, a writing transistor 23, a holding capacitor 24, and an auxiliary capacitor 25. That is, the drive circuit has a 2Tr2C circuit configuration having two transistors (Tr) and two capacitors (C). Here, an N-channel thin film transistor (TFT) is used as the driving transistor 22 and the writing transistor 23. However, the combination of the conductivity types of the driving transistor 22 and the writing transistor 23 illustrated here is only exemplary, and the combination is not limited to the above.

In the driving transistor 22, one electrode (source/drain electrode) is connected to the power supply lines 32 ($32_1$ to $32_m$), and the other electrode (source/drain electrode) is connected to an anode electrode of the organic EL element 21. In the writing transistor 23, one electrode (source/drain electrode) is connected to the signal lines 33 ($33_1$ to $33_n$), and the other electrode (source/drain electrode) is connected to a gate electrode of the driving transistor 22. Furthermore, a gate electrode of the writing transistor 23 is connected to the scanning lines 31 ($31_1$ to $31_m$).

In the driving transistor 22 and the writing transistor 23, the one electrode is a metal wiring electrically connected to one source/drain region, and the other electrode a metal wiring is electrically connected to the other source/drain region. Furthermore, depending on a potential relationship between the electrodes, the one electrode may be the source electrode and the drain electrode, and the other electrode may be the source electrode and the drain electrode.

One electrode of the holding capacitor 24 is connected to a gate electrode of the driving transistor 22, and the other electrode is connected to the other electrode of the driving transistor 22 and the anode electrode of the organic EL element 21. One of the electrodes of the auxiliary capacitor 25 is connected to the anode electrode of the organic EL element 21, and the other electrode is connected to the cathode electrode of the organic EL element 21, that is, connected to the organic EL element 21 in parallel.

In the above configuration, the writing transistor 23 is turned on in response to the write scanning signal WS which is applied to the gate electrode from the write scanning unit 40 through the scanning line 31 and is active in the high voltage state. As a result, the writing transistor 23 samples the signal voltage $V_{sig}$ of the video signal corresponding to the luminance information or the reference voltage $V_{ofs}$ which are supplied from the signal outputting unit 60 via the signal lines 33 at different timings and writes the sampled signal into the pixel 20. The signal voltage $V_{sig}$ or the reference voltage $V_{ofs}$ written by the writing transistor 23 is held by the holding capacitor 24.

When the power supply voltage DS of the power supply line 32 ($32_1$ to $32_m$) is the first power supply voltage $V_{ccp}$, the driving transistor 22 operates in a saturation region in a state where one electrode serves as a drain electrode and the other electrode serves as a source electrode. As a result, the driving transistor 22 receives current from the power supply line 32 and drives the organic EL element 21 to emit light by a current drive. More specifically, by operating in the saturation region, the driving transistor 22 supplies a drive current having a current value corresponding to the voltage value of the signal voltage $V_{sig}$ held by the holding capacitor 24 to the organic EL element 21 and drives the organic EL element 21 to emit light by the current drive.

In addition, when the power supply voltage DS is switched from the first power supply voltage $V_{ccp}$ to the second power supply voltage $V_{ini}$, the driving transistor 22 operates as a switching transistor in a state where one electrode serves as a source electrode and the other electrode serves as a drain electrode. As a result, the driving transistor 22 stops the supply of the driving current to the organic EL element 21, and causes the organic EL element 21 not to emit light. That is, the driving transistor 22 also has a function as a transistor for controlling the emission/non-emission of the organic EL element 21.

With the switching operation of the driving transistor 22, a period (non-light emitting period) in which the organic EL element 21 does not emit light can be provided, and a ratio (duty) between the light emitting period and the non-light emitting period of the organic EL element 21 can be controlled. With the duty control, a blur in an afterimage caused by light emission by the pixel for a single display frame period can be reduced. Therefore, especially, an image quality of the moving image can be improved.

In the first and second power supply voltages $V_{ccp}$ and $V_{ini}$ selectively supplied from the power supply scanning unit 50 via the power supply lines 32, the first power supply voltage $V_{ccp}$ is power supply voltage to supply the drive current to drive the organic EL element 21 to emit light to the driving transistor 22. Furthermore, the second power supply voltage $V_{ini}$ is a power supply voltage for applying a reverse bias to the organic EL element 21. The second power supply voltage $V_{ini}$ is set to be a voltage lower than the reference voltage $V_{ofs}$, for example, a voltage lower than $V_{ofs}-V_{th}$ when a threshold voltage of the driving transistor 22 is $V_{th}$, and preferably a voltage sufficiently lower than $V_{ofs}-V_{th}$.

Each pixel 20 of the pixel array unit 30 has a function for correcting a variation in driving currents caused by a variation in characteristics of the driving transistor 22. As the characteristics of the driving transistor 22, for example, the threshold voltage $V_{th}$ of the driving transistor 22 and a mobility μ of a semiconductor thin film forming a channel of the driving transistor 22 (simply referred to as "mobility μ of driving transistor 22" below) can be exemplified.

The correction (referred to as "threshold correction" below) of the variation in the driving currents caused by the variation in the threshold voltages $V_{th}$ is performed by initializing a gate voltage $V_g$ of the driving transistor 22 to the reference voltage $V_{ofs}$. Specifically, an operation is performed for changing a source voltage $V_s$ of the driving transistor 22 toward a potential obtained by subtracting the threshold voltage $V_{th}$ of the driving transistor 22 from the initialized voltage with reference to the initialized voltage (reference voltage $V_{ofs}$) of the gate voltage $V_g$ of the driving transistor 22. As this operation proceeds, a gate-source voltage $V_{gs}$ of the driving transistor 22 eventually converges to the threshold voltage $V_{th}$ of the driving transistor 22. A voltage corresponding to the threshold voltage $V_{th}$ is held by the holding capacitor 24. Furthermore, since the voltage corresponding to the threshold voltage $V_{th}$ is held by the holding capacitor 24, dependency on the threshold voltage $V_{th}$ of a drain-source current $I_{ds}$ flowing in the driving transistor 22 can be reduced when the signal voltage $V_{sig}$ of the video signal drives the driving transistor 22.

On the other hand, the correction of the variation in driving currents caused by the variation in mobility μ (referred to as "mobility correction" below) is performed by making the current flow in the holding capacitor 24 via the driving transistor 22 in a state where writing transistor 23 is turned on and writes the signal voltage $V_{sig}$ of the video signal. In other words, the mobility correction is performed by applying a negative feedback to the holding capacitor 24 with a feedback amount (correction amount) according to the current $I_{ds}$ flowing through the driving transistor 22. With the threshold correction, the dependency on the threshold voltage $V_{th}$ of the drain-source current $I_{ds}$ has been already canceled when the video signal has been written, and the drain-source current $I_{ds}$ depends on the mobility μ of the driving transistor 22. Therefore, by applying the negative feedback to a drain-source voltage $V_{ds}$ of the driving transistor 22 with a feedback amount according to the current $I_{ds}$ flowing in the driving transistor 22, the dependency on the mobility μ of the drain-source current $I_{ds}$ flowing in the driving transistor 22 can be reduced.

Method of Realizing Full Color

The organic EL display device 10, in which the unit pixels 20 formed of a plurality of sub-pixels having different luminescent colors is arranged in a matrix form, employs, for example, a method for combining a white organic EL element and a color filter to extract white light by laminating the light emitting layers of three colors of R, G, and B (referred to as "white method" below) as a method of realizing full color. With the white method, the white light is extracted by laminating the light emitting layers of three colors of RGB over all the pixels (sub-pixels). Therefore, a problem in mask alignment accuracy as in the RGB coloring method does not occur, and especially, the white method is a method of realizing full color useful for fine pixel pitches of about several microns, such as an ultra-small display. However, in a case of the white system, the white light emitted from the white organic EL element is decomposed by the color filter and ⅔ of the white light is blocked so as to extract light of single color. Therefore, a loss is large, and the luminous efficiency is reduced to, for example, equal to or less than ⅓ of that of the RGB coloring method.

Resonator Structure

Therefore, in the organic EL display device 10 employing the method for combining the white organic EL element and the color filter, a resonator structure is employed to achieve high luminous efficiency and to improve color reproducibility. In the resonator structure, a microcavity structure is formed by making optical path length between a reflective film and a transparent electrode be different for each color of R, G, and B, and light having a specific wavelength is emphasized and extracted by a resonance effect. A conventional example of a resonator structure is described below with reference to FIG. 3.

Figure 3:
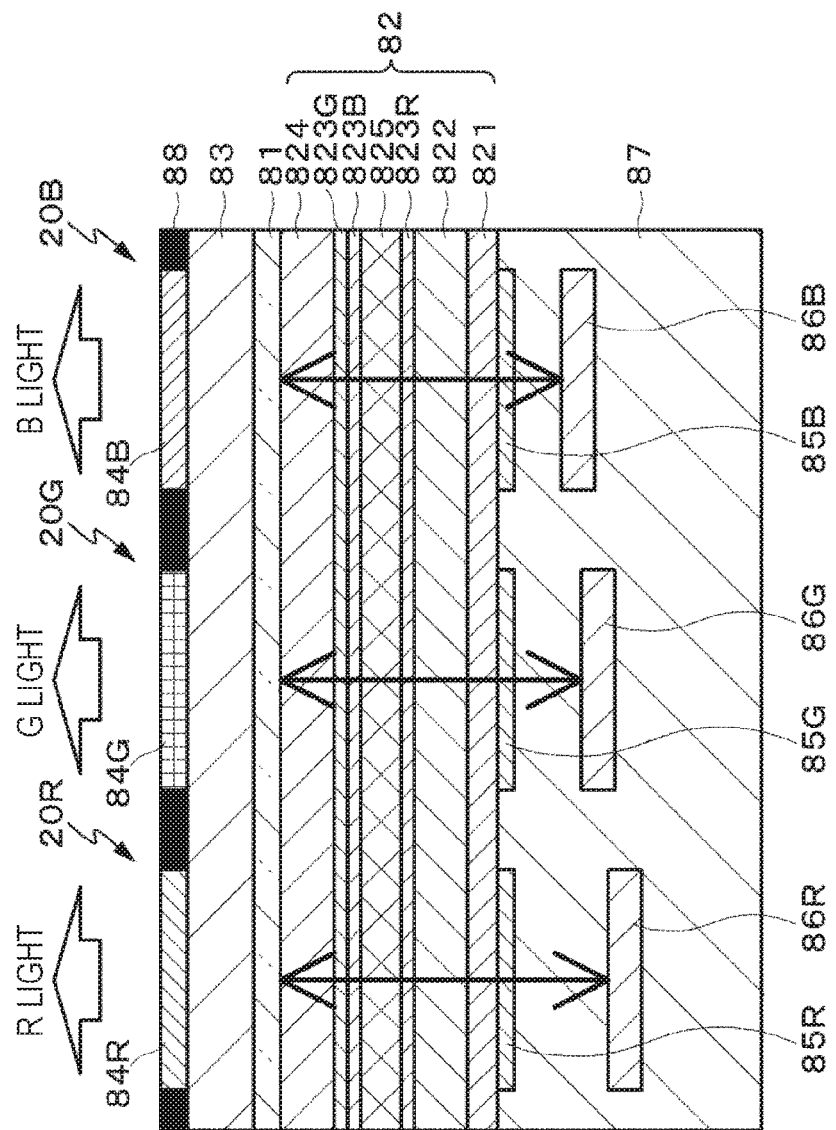
FIG. 3 is a cross-sectional diagram of a pixel structure of three R, G, and B sub-pixels having a resonator structure according to a conventional example.

FIG. 3 is a cross-sectional diagram of a pixel structure of three sub-pixels 20R, 20G, and 20B of red (R), green (G), and blue (B) having the resonator structure according to the conventional example. In the pixel structure according to the conventional example illustrated in FIG. 3, a cathode electrode 81 is made of, for example, an alloy (Mg—Ag alloy) of magnesium (Mg) and silver (Ag) and functions as a semi-transmissive plate (semi-transmissive electrode). The cathode electrode 81 is provided for all pixels (sub-pixels) in common. The cathode electrode 81 is formed on an organic layer 82 which is a light emitting function layer. A protective film 83 for protecting the cathode electrode 81 is formed on the cathode electrode 81, and RGB color filters 84R, 84G, and 84B are arranged on the protective film 83.

The organic layer 82 is a white light emitting function layer for emitting white light and is formed on anode electrodes 85R, 85G, and 85B formed of a transparent conductive material such as indium tin oxide (ITO). Specifically, in the organic layer 82, a hole injection layer 821, a hole transport layer 822, RBG light emitting layers 823R, 823B, and 823G, and an electron transport layer 824 are laminated in this order from the side of the anode electrodes 85R, 85G, and 85B. The laminated layers are formed of organic materials. An intermediate layer 825 is interposed between the R light emitting layer 823R and the B light emitting layer 823B.

In the organic layer 82 having the above configuration, the hole injection layer 821 and the hole transport layer 822 improve a hole injection efficiency into the light emitting layers 823R, 823B, and 823G. The flow of the current makes the light emitting layers 823R, 823B, and 823G respectively emit red, green, and blue light. The electron transport layer 824 improves an electron injection efficiency into the light emitting layers 823R, 823B, and 823G. The intermediate layer 825 causes the RBG light emitting layers 823R, 823B, and 823G to emit light with good balance.

Reflection plates 86R, 86G, and 86B formed of, for example, an alloy (Al—Cu alloy) of aluminum (Al) and copper (Cu) are provided below the anode electrodes 85R, 85G, and 85B for each R, G, and B sub-pixels 20R, 20G, and 20B. Furthermore, an interlayer film 87 is interposed between the anode electrodes 85R, 85G, and 85B and the reflection plates 86R, 86G, and 86B. As described later, the interlayer film 87 optimizes the optical path length (distance indicated by arrows in FIG. 3) of the resonator structure according to the film thickness. The film thickness of the interlayer film 87 is controlled by sputtering or a chemical vapor deposition (CVD) process. Light shielding films 88 as black matrix are provided between the color filters 84R, 84G, and 84B.

In the pixel structure according to the conventional example having the above configuration, the resonator structure that resonates the light generated in the organic layer 82 which is the white light emitting function layer is formed of the cathode electrode 81 which is a semi-transmissive electrode and the reflection plates 86R, 86G, and 86B. In the resonator structure, by changing the film thickness of the interlayer film 87 interposed between the anode electrodes 85R, 85G, and 85B and the reflection plates 86R, 86G, and 86B, the optical path lengths between the cathode electrode 81 and the reflection plates 86R, 86G, and 86B are changed for each color and optimized, and the luminescent colors of the pixels (sub-pixel) are different from each other.

In the organic EL display device 10 including the sub-pixels 20R, 20G, and 20B having the resonator structure, to maximize the resonance effect, it is necessary to reduce variation in the final optical path length of the resonator structure, that is, the final optical path length between the cathode electrode 81 and the reflection plates 86R, 86G, and 86B.

In the pixel structure according to the conventional example having the above configuration, the film thickness control of the interlayer film 87 to optimize the final optical path length of the resonator structure is performed by sputtering and the CVD process. However, when the film thickness is controlled by sputtering and the CVD process, it is more difficult to accurately control the film thickness than a case where the film thickness is controlled by a vapor deposition process, and the film thickness easily varies. Then, when a gap is generated between the film thicknesses, the optical path lengths between the cathode electrode 81 and the reflection plates 86R, 86G, and 86B are different for each luminescent color, and this causes color variation and variation in the luminous efficiency.

One Embodiment of the Present Disclosure

Therefore, in one embodiment of the present disclosure, the organic EL display device 10 including the sub-pixels 20R, 20G, and 20B having the resonator structure employs a configuration which can accurately control the optical path length of the resonator structure. Specifically, in the present embodiment, the configuration is employed in which the optical path length of the resonator structure, that is, optical path lengths between the cathode electrode 81 and the reflection plates 86R, 86G, and 86B are optimized by controlling the film thickness of the organic layer 82 by the vapor deposition process, instead of controlling the film thickness of the interlayer film 87 by sputtering and the CVD process.

Furthermore, in the pixel structure according to the conventional example having the resonator structure described above, the organic layer 82 which is the white light emitting function layer for emitting white light is formed by laminating the color light emitting layers 823R, 823B, and 823G of three colors of R, B, and G. However, the forming method of the white light emitting function layer is not limited to this. For example, a white light emitting function layer for emitting white light can also be formed by laminating two light emitting layers, i.e., a light emitting layer for emitting blue (B) light and a light emitting layer for emitting yellow (Ye) light.

The organic EL display device 10 according to the present embodiment includes a first electrode, an inorganic hole injecting and transporting layer formed of an inorganic material on the first electrode, and at least two light emitting units including a first organic light emitting unit and a second organic light emitting unit which respectively emit light of different colors and are formed on the inorganic hole injecting and transporting layer. The organic EL display device 10 further includes an electron transport layer formed on the two organic light emitting units and a second electrode formed on the electron transport layer. Furthermore, a light emitting layer of the first organic light emitting unit is formed by laminating a light emitting layer of a first luminescent color and a light emitting layer of a second luminescent color, and a light emitting layer of the second organic light emitting unit is formed of the light emitting layer of the second luminescent color. The first electrode is an anode electrode which is a lower electrode, and the second electrode is a cathode electrode which is an upper electrode.

Here, it has been known that an etching rate of an inorganic material is much lower than that of an organic material. In other words, the inorganic material is more hardly etched than the organic material. Therefore, by providing the inorganic hole injecting and transporting layer formed of the inorganic material on the anode electrode which is the lower electrode, the film thickness of the organic layer (organic light emitting unit) can be controlled by the vapor deposition process without using a mask. Furthermore, by controlling the film thickness of the organic layer by the vapor deposition process, the film thickness can be controlled with higher accuracy than the film thickness control by sputtering or the CVD process. With this structure, the optical path length of the resonator structure can be controlled with high accuracy. Therefore, the optical path length of the resonator structure can be optimized for each luminescent color, and the variation in the optical path lengths of the resonator structure between the luminescent colors can be reduced. As a result, the variations in the color and the luminous efficiency can be reduced.

Specific examples of the present embodiment to enable the control of the optical path length of the resonator structure with high accuracy are described below. A case is described below where the organic layer which is the white light emitting function layer for emitting white light is formed by the laminating the light emitting layers of three colors of R, B, and G as an example. However, the organic layer is not limited to the lamination of the light emitting layers of three colors of R, B, and G. Specifically, a configuration formed by laminating at least two light emitting layers can be employed, for example, the two light emitting layers are the light emitting layer for emitting blue light and the light emitting layer for emitting yellow light.

First Embodiment

Figure 4:
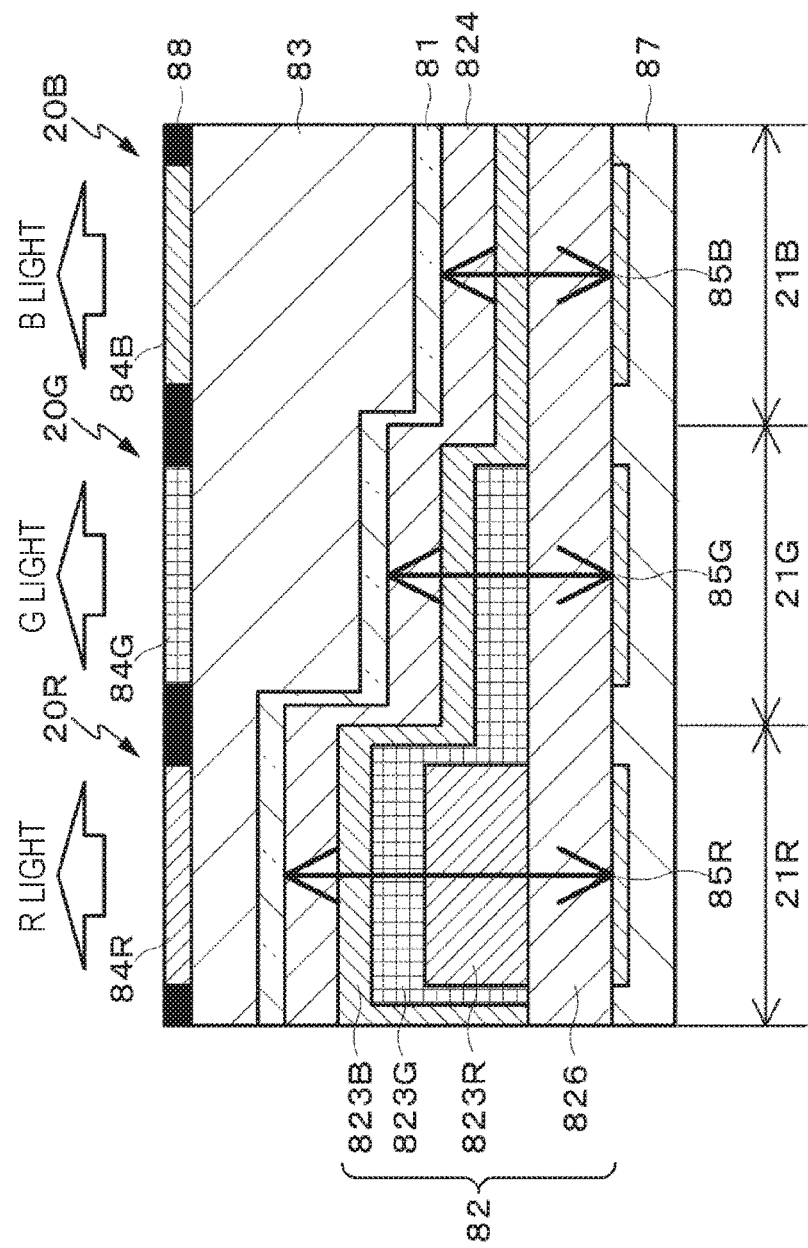
FIG. 4 is a cross-sectional diagram of a pixel structure of three R, G, and B sub-pixels having a resonator structure according to a first embodiment.

FIG. 4 is a cross-sectional diagram of a pixel structure of three R, G, and B sub-pixels having a resonator structure according to a first embodiment.

In the pixel structure according to the first embodiment, for example, three organic EL elements 21R, 21G, and 21B of red (R), green (G), and blue (B) respectively include sub-pixels 20R, 20G, and 20B. Furthermore, these sub-pixels 20R, 20G, and 20B are two-dimensionally arranged in a matrix on a driving substrate (not shown) which is a backplane substrate including an interlayer film 87. The driving substrate is formed of, for example, a transparent glass substrate or a semiconductor substrate (for example, silicon substrate). The driving substrate may have a flexible configuration. The drive circuit including the driving transistor 22 and the writing transistor 23 illustrated in FIG. 2 is formed on the driving substrate.

Here, the outline of the configurations of the TFT used as the driving transistor 22 and the writing transistor 23 and the peripheral part is described. The TFT is, for example, a bottom gate type thin film transistor and has a gate electrode in a selective region on the driving substrate. A gate insulating film is provided over the entire surface of the driving substrate to cover the gate electrode and the driving substrate. A semiconductor layer is formed on the gate insulating film. The semiconductor layer is formed of amorphous silicon, polycrystal silicon, or an oxide semiconductor.

An interlayer insulating film having a contact hole is formed on the semiconductor layer. A source/drain electrode is arranged on the interlayer insulating film, and the source/drain electrode is formed to be fitted into the contact hole of the interlayer insulating film so that the source/drain electrode is electrically connected to the semiconductor layer which functions as a source/drain region. The TFT is covered with a flattening film on the driving substrate. The flattening film is made of an organic insulating film such as polyimide, acrylic resin, or novolak resin or an inorganic insulating film such as silicon oxide ($SiO_x$), silicon nitride ($SiN_x$), or silicon oxynitride (SiON).

In FIG. 4, the red organic EL element 21R includes an anode electrode 85R, an inorganic hole injecting and transporting layer 826, a red light emitting layer 823R, a green light emitting layer 823G, a blue light emitting layer 823B, an electron transport layer 824, and a cathode electrode 81 laminated in this order on the driving substrate. The anode electrodes 85R, 85G, and 85B as first electrodes are lower electrodes provided on the lower side (side opposite to light extraction side) of an organic layer 82. The cathode electrode 81 as a second electrode is an upper electrode provided on the upper side (light extraction side) of the organic layer 82.

The green organic EL element 21G includes the anode electrode 85G, the inorganic hole injecting and transporting layer 826, the green light emitting layer 823G, the blue light emitting layer 823B, the electron transport layer 824, and the cathode electrode 81 laminated in this order on the driving substrate from the bottom. The blue organic EL element 21B includes the anode electrode 85B, the inorganic hole injecting and transporting layer 826, the blue light emitting layer 823B, the electron transport layer 824, and the cathode electrode 81 laminated in this order on the driving substrate from the bottom.

The cathode electrode 81 is provided in common to the red organic EL element 21R, the green organic EL element 21G, and the blue organic EL element 21B. A counter substrate (not shown) having a protective film 83 and color filters 84R, 84G, and 84B is provided on the cathode electrode 81.

The anode electrodes 85R, 85G, and 85B are reflective electrodes formed of light reflecting materials such as aluminum (Al), an aluminum alloy, silver (Ag), platinum (Pt), gold (Au), chromium (Cr), and tungsten (W). It is preferable that the thickness of each of the anode electrodes 85R, 85G, and 85B be set to, for example, 100 to 300 nm.

Here, it is assumed that the anode electrodes 85R, 85G, and 85B be the reflective electrodes. However, the anode electrodes may be transparent electrodes. In a case where the anode electrodes 85R, 85G, and 85B are the transparent electrodes, it is preferable to provide a reflection layer formed of light reflecting materials such as Al, Ag, Pt, Au, Cr, and W to form a first reflective interface between the anode electrodes 85R, 85G, and 85B and the driving substrate. The anode electrodes 85R, 85G, and 85B are provided to be insulated from the cathode electrode 81.

A hole injecting and transporting layer made of an inorganic material, that is, the inorganic hole injecting and transporting layer 826 has a function for injecting holes from the anode electrodes 85R, 85G, and 85B and transporting the holes to the light emitting layers 823R, 823B, and 823G. For example, the inorganic hole injecting and transporting layer 826 mainly contains silicon or germanium oxide as a known material, and the inorganic hole injecting and transporting layer 826 is formed of a material which satisfies $0 \leq x \leq 1$ and $1.7 \leq x \leq 2.2$ when the main component is represented by $(Si_xGe_{1-x})O_y$.

The red light emitting layer 823R may be a fluorescent material or a phosphorescent material. Specifically, the red light emitting layer 823R is formed of, for example, a mixture of 30 wt. % of 2,6-bis [(4'-methoxydiphenylamino) styryl-1,5-dicyanonaphthalene (BSN) in 4,4-bis (2,2-diphenylvinyl) biphenyl (DPVBi). The green light emitting layer 823G may be a fluorescent material or a phosphorescent material. Specifically, the green light emitting layer 823G is formed of, for example, a mixture of five wt. % of coumarin 6 in DPVBi. The blue light emitting layer 823B may be a fluorescent material or a phosphorescent material. Specifically, the blue light emitting layer 823B is formed of, for example, a mixture of 2.5 wt. % of 4,4'-bis [2-{4-(N, N-diphenylamino) phenyl} vinyl] biphenyl (DPAVBi) in DPVBi.

The electron transport layer 824 is formed of, for example, 2,9-dimethyl-4,7-diphenyl-1,10-phenanthroline (BCP), aluminum quinolinol ($Alq_3$), bathophenanthroline (Bphen), and the like. The electron transport layer 824 includes at least one layer and may include at least one electron transport layer 824 doped with alkali metal or alkaline earth metal.

The electron transport layer 824 doped with alkali metal or alkaline earth metal is formed by doping, for example, 0.5 to 15 wt. % of a dopant material with 2,9-dimethyl-4,7-diphenyl-1,10-phenanthroline (BCP), aluminum quinolinol ($Alq_3$), Bathophenanthroline (Bphen), and the like as a host material by co-evaporation. As the dopant material, alkali metals such as lithium (Li), sodium (Na), potassium (K), rubidium (Rb), and cesium (Cs) or alkaline earth metals such as magnesium (Mg), calcium (Ca), strontium (Sr), and barium (Ba) can be exemplified.

In the present embodiment, the configuration in which the cathode electrode 81 is provided on the electron transport layer 824 has been exemplified. However, a configuration in which an electron injection layer is provided between the electron transport layer 824 and the cathode electrode 81 may be employed. The electron injection layer increases the injection of electrons from the cathode electrode 81 and is made of, for example, lithium fluoride (LiF).

Regarding the thicknesses of the layers forming the organic EL elements 21R, 21G, and 21B, for example, it is preferable that the thickness of the inorganic hole injecting and transporting layer 826 be set to one to 200 nm, the thickness of each of the light emitting layers 823R, 823G, and 823B be set to five to 50 nm, and the thickness of the electron transport layer 824 be set to 10 to 200 nm. The thickness of each layer forming the organic EL elements 21R, 21G, and 21B is set to a value such that the optical film thickness enables the operation of each layer.

The cathode electrode 81 is made of a metal layer of, for example, magnesium (Mg), silver (Ag), or an alloy of the magnesium and silver, which has an excellent optical transparency and has a small work function. It is preferable that the thickness of the cathode electrode 81 be set to, for example, three to 15 nm.

The cathode electrode 81 may be formed as a multilayer film. In a case where the cathode electrode 81 is formed as the multilayer film, for example, a first layer is formed of a metal layer of calcium (Ca), barium (Ba), lithium (Li), cesium (Cs), indium (In), magnesium (Mg), and silver (Ag), and a second layer is formed of a metal layer of magnesium (Mg), silver (Ag) or an alloy of magnesium and silver.

The protective film 83 on the cathode electrode 81 prevents entrance of moisture to the organic layer 82 and is formed by using a material with low permeability and low water permeability, and the thickness of the protective film 83 is, for example, one to eight μm. As the material of the protective film 83, silicon nitride (SiN$_x$), silicon oxide (SiO$_x$), aluminum oxide (AlO$_x$), or a combination of these can be used.

The counter substrate (not shown) arranged on the protective film 83 is formed by forming the protective film 83, then applying UV curing resin or thermosetting resin to bond and seal the protective film 83. On the counter substrate, the color filters 84R, 84G, and 84B and a light shielding film 88 as a black matrix are provided. With this structure, the light generated by the organic EL elements 21R, 21G, and 21B is color-divided and extracted, and external light reflected by wiring between the organic EL elements 21R, 21G, and 21B is absorbed so as to improve a contrast.

An inter-pixel insulating film (not shown) is formed over an entire surface of the driving substrate on which the anode electrodes 85R, 85G, and 85B are arranged. The inter-pixel insulating film has a function for electrically separating the organic EL elements 21R, 21G and 21B. For example, the inter-pixel insulating film is formed of an organic insulating film such as polyimide, acrylic resin, and novolak resin or an inorganic insulating film such as silicon oxide (SiO$_x$), silicon nitride (SiN$_x$), and silicon oxynitride (SiON).

In the pixel structure according to the first embodiment having the above configuration, the resonator structure is formed by the anode electrodes 85R, 85G, and 85B which are the reflective electrodes and the cathode electrode 81 which is the translucent electrode. In the resonator structure, a microcavity structure is formed by making the optical path length between the anode electrodes 85R, 85G, and 85B and the cathode electrode 81 (distance indicated by arrows in FIG. 3), that is, the optical path length of the resonator structure be different for each color of R, G, and B, and the light having the specific wavelength is emphasized by the resonance effect.

In the pixel structure according to the first embodiment, the inorganic hole injecting and transporting layer 826 made of the inorganic material having an etching rate much lower than that of the organic material is used as a hole injecting and transporting layer. Therefore, the thickness of the organic layer 82 can be controlled by the vapor deposition process without using the mask. Furthermore, in the pixel structure according to the first embodiment, the optical path length of each color of R, G, and B is adjusted by controlling the film thickness of the organic layer 82 by the vapor deposition process.

With the film thickness control of the organic layer 82 by the vapor deposition process, since the film thickness can be controlled with higher accuracy than the film thickness control by the sputtering or the CVD process, the optical path length of the resonator structure can be controlled with high accuracy. With this structure, the optical path length of the resonator structure can be optimized for each luminescent color, and the variations in the optical path lengths of the resonator structure between the luminescent colors can be reduced. Therefore, the organic EL device with less variations in color and luminous efficiency and with high efficiency can be obtained.

Furthermore, in the pixel structure according to the first embodiment, the red light emitting layer 823R, the green light emitting layer 823G, and the blue light emitting layer 823B are directly laminated in the red sub-pixel 20R, and the green light emitting layer 823G and the blue light emitting layer 823B are directly laminated in the green sub-pixel 20R. In the pixel structure (refer to FIG. 3) according to the conventional example described above, the organic layer 82 is formed of the white light emitting function layer including the intermediate layer 825 and emits white light.

Whereas, in the pixel structure according to the first embodiment having the above configuration, the organic EL element 21R emits red light, the organic EL element 21G emits green light, and the organic EL element 21B emits blue light. To obtain such a light emission state, a design is employed in which the organic EL element 21R emits the red light and the organic EL element 21G emits the green light. A known technology can be used for this design. Specifically, for example, the electron mobility of the electron transport layer 824 is made to be larger than the hole mobility of the inorganic hole injecting and transporting layer 826.

Furthermore, in the organic EL element 21R, a barrier against electrons at the interface between the electron transport layer 824 and the blue light emitting layer 823B is made to be smaller than a barrier against holes at the interface between the inorganic hole injecting and transporting layer 826 and the red light emitting layer 823R. This can prevent the light emission of the green light emitting layer 823G and the blue light emitting layer 823B in the red sub-pixel 20R. Furthermore, in the organic EL element 21G, a barrier against electrons at the interface between the electron transport layer 824 and the blue light emitting layer 823B is made to be smaller than a barrier against holes at the interface between the inorganic hole injecting and transporting layer 826 and the green light emitting layer 823G. This can prevent the light emission of the blue light emitting layer 823B in the green sub-pixel 20G.

The light emission of the green light emitting layer 823G and the blue light emitting layer 823B in the red sub-pixel 20R can be prevented, and the light emission of the blue light emitting layer 823B in the green sub-pixel 20G can be prevented. However, not all light emission is prevented. On the other hand, in the pixel structure according to the first embodiment, the resonator structure is employed. Therefore, with the action of the resonator structure, red light can be emphasized and extracted in the red sub-pixel 20R, and green light can be emphasized and extracted in the green sub-pixel 20G.

In a case of the pixel structure according to the conventional example in which the organic layer 82 is formed of the white light emitting function layer, the white light emitted from the organic layer 82 which is the white light emitting function layer is decomposed by the color filters 84R, 94G, and 84B and ⅔ of the white light is blocked to extract the light of a single color. Therefore, the loss is large, and the luminous efficiency is lowered to about ⅓. Whereas, in the pixel structure according to the first embodiment, the organic EL element 21R emits the red light, the organic EL element 21G emits the green light, and the organic EL element 21B emits the blue light. Therefore, the luminous efficiencies of the sub-pixels 20R, 20G, and 20B can be largely improved than that in the pixel structure according to the conventional example.

Furthermore, in the first embodiment, the pixel structure including the color filters 84R, 84G, and 84B has been exemplified. However, the organic EL element 21R emits the red light, the organic EL element 21G emits the green light, and the organic EL element 21B emits the blue light. Therefore, the color filters 84R, 84G, and 84B can be omitted. However, to absorb the external light reflected by the wiring between the organic EL elements 21R, 21G, and 21B and to improve the contrast, it is preferable to employ the pixel structure including the color filters 84R, 84G, and 84B. This is similarly applied to each of the embodiments below.

Manufacturing Method

The organic EL display device 10 having the pixel structure according to the first embodiment having the above configuration can be manufactured as follows.

First, a drive circuit including a TFT is formed on the driving substrate made of the above-described materials through a predetermined thin film process, and then a flattening film is formed over the entire surface of the substrate by, for example, a spin coating method or a slit coating method. Subsequently, the formed flattening film is patterned into a predetermined shape by, for example, photolithography, and a contact hole is formed in the flattening film.

Next, on the driving substrate on which the anode electrodes 85R, 85G, and 85B have been formed, the inter-pixel insulating film for electrically isolating the organic EL elements 21R, 21G, and 21B is formed by, for example, by forming an inorganic insulating film such as silicon oxynitride (SiON) by the CVD method or a sputtering method. Subsequently, the formed inter-pixel insulating film is patterned into a predetermined shape by, for example, dry etching to form pixel openings.

The procedure for manufacturing the pixel structure according to the first embodiment below is described with reference to process diagrams in FIGS. 5A to 5C (part 1), process diagrams in FIGS. 6A and 6B (part 2), and process diagrams in FIGS. 7A and 7B (part 3).

Figure 5A:
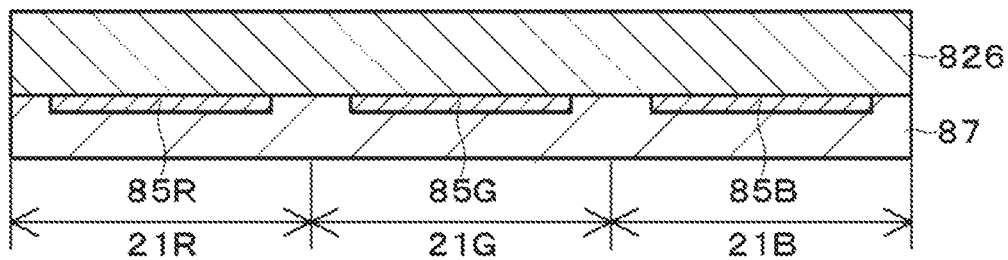
FIGS. 5A to 5C are process diagrams (No. 1) of a procedure of manufacturing the pixel structure according to the first embodiment.
Figure 5B:
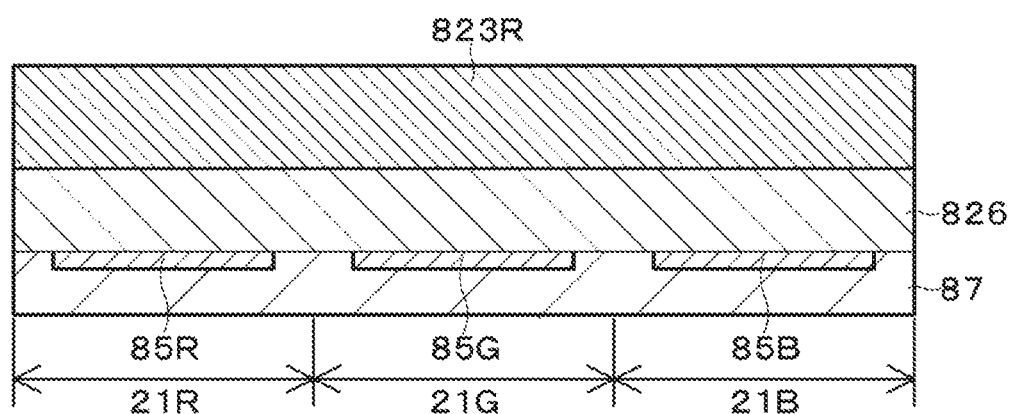
Figure 5C:
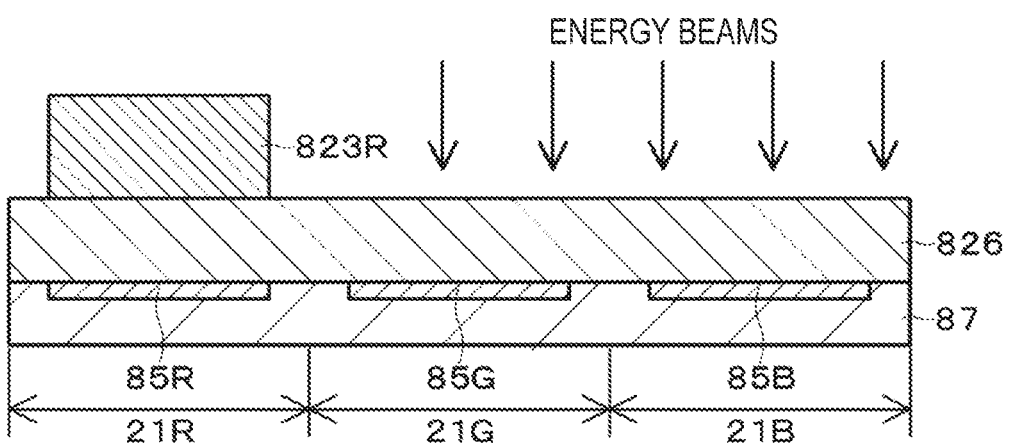

First, the inorganic hole injecting and transporting layer 826 made of the above-described materials is formed over the entire surface of the driving substrate by the sputtering method, for example (FIG. 5A). Next, the red light emitting layer 823R is formed over the entire surface of the driving substrate by, for example, a line evaporation method (FIG. 5B). Next, the red light emitting layer 823R on the inorganic hole injecting and transporting layer 826 in a green pixel region and a blue pixel region is removed by irradiating energy beams, for example, argon ion beams (FIG. 5C). As the energy beam, any one of a laser beam, an electron beam, a molecular beam, an ion beam, and the like can be used.

Figure 6A:
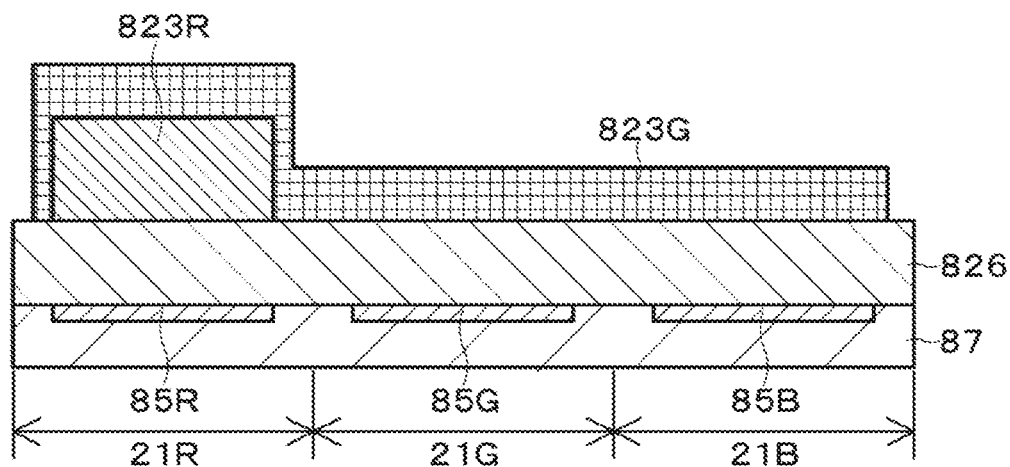
FIGS. 6A and 6B are process diagrams (No. 2) of the procedure of manufacturing the pixel structure according to the first embodiment.
Figure 6B:
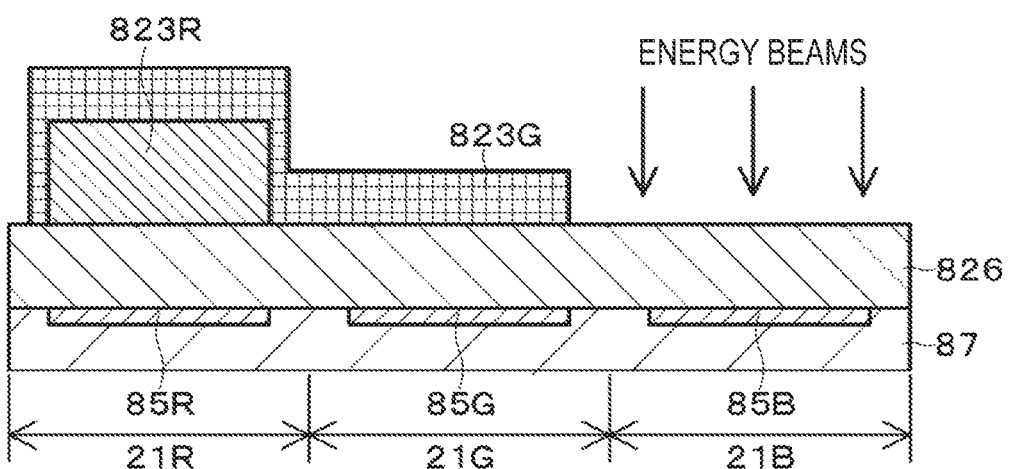
Figure 7A:
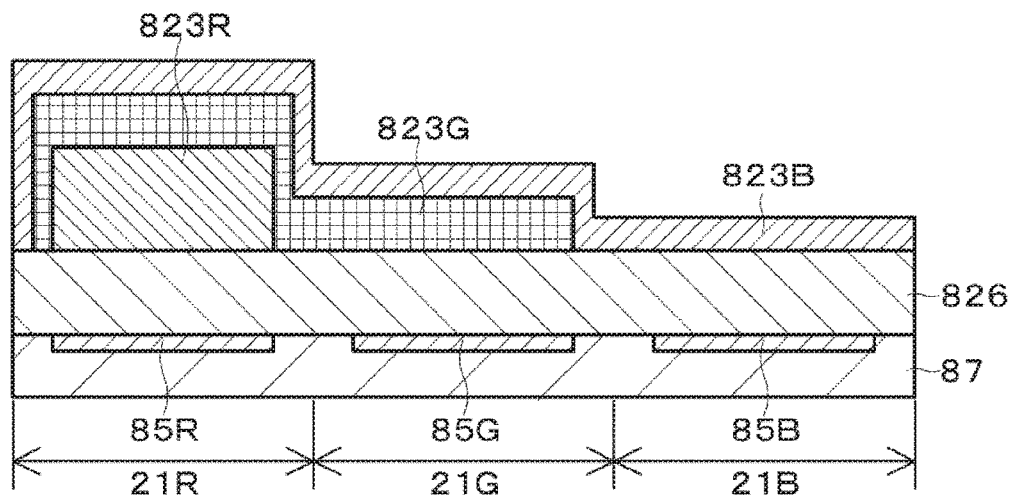
FIGS. 7A and 7B are process diagrams (No. 3) of the procedure of manufacturing the pixel structure according to the first embodiment.
Figure 7B:
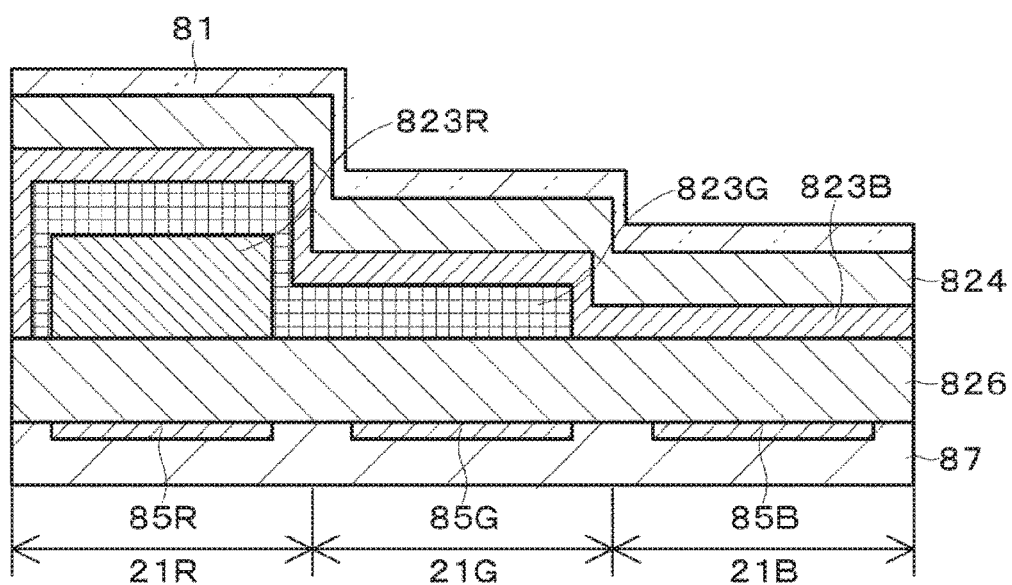

Subsequently, the green light emitting layer 823G is formed over the entire surface of the driving substrate by, for example, the line evaporation method (FIG. 6A). Next, the green light emitting layer 823G on the inorganic hole injecting and transporting layer 826 in the blue pixel region is removed by, for example, irradiating the argon ion beams (FIG. 6B). Next, the blue light emitting layer 823B is formed over the entire surface of the driving substrate by, for example, the line evaporation method (FIG. 7A). Subsequently, the electron transport layer 824 and the cathode electrode 81 are formed by, for example, a vapor deposition method (FIG. 7B).

Subsequently, the protective film 83 is formed to cover the entire surface of the formed cathode electrode 81, and after that, the driving substrate and the counter substrate are bonded together by using an adhesive resin. With the above series of processing, the organic EL display device 10 having the pixel structure according to the first embodiment is completed.

Second Embodiment

Figure 8:
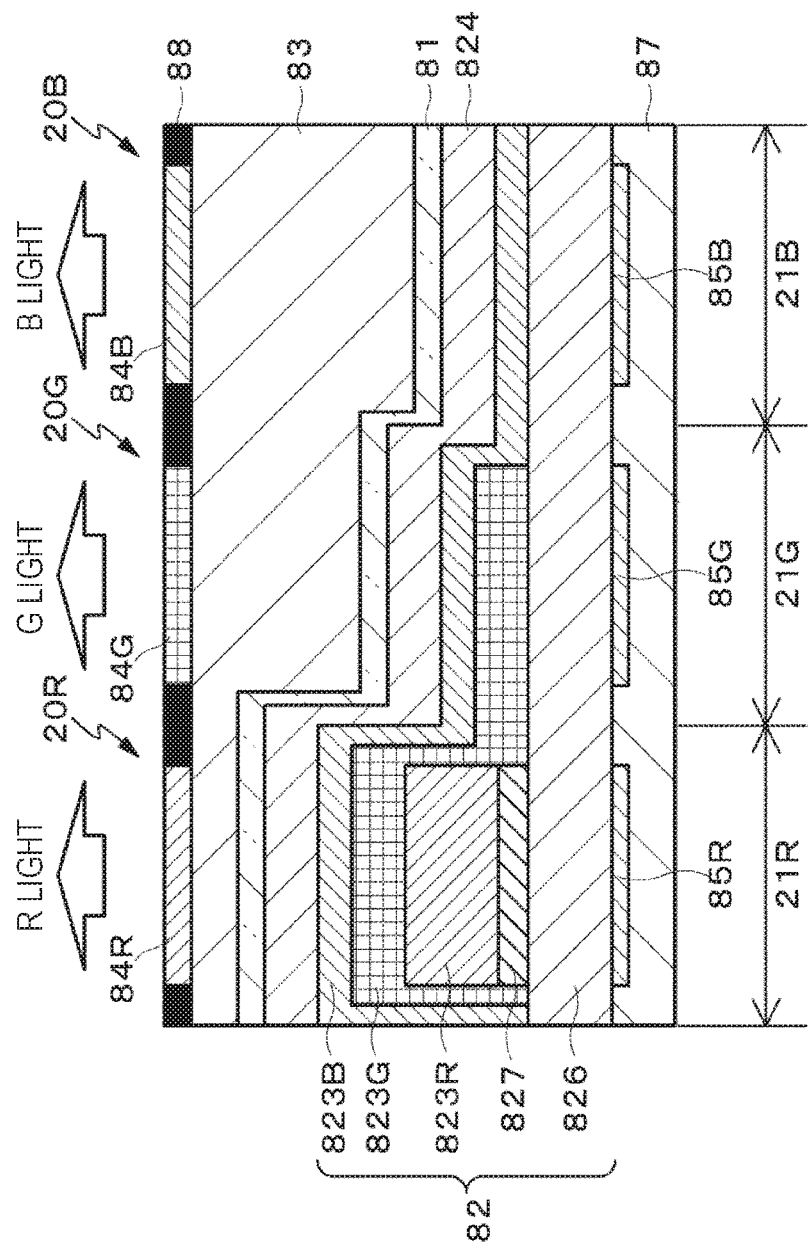
FIG. 8 is a cross-sectional diagram of a pixel structure of three R, G, and B sub-pixels having a resonator structure according to a second embodiment.

A second embodiment is a modification of the first embodiment. FIG. 8 is a cross-sectional diagram of a pixel structure of three R, G, and B sub-pixels having a resonator structure according to a second embodiment.

As illustrated in FIG. 8, in the pixel structure according to the second embodiment, a red organic EL element 21R has an optical path length adjusting layer 827 between an inorganic hole injecting and transporting layer 826 and a red light emitting layer 823R. The pixel structure other than the above is configured similarly to the pixel structure according to the first embodiment. The optical path length adjusting layer 827 is made of an organic material having a hole transporting property and, for example, made of α-NPD [N, N'-di (1-naphthyl)-N, N'-diphenyl-[1,1'-biphenyl]-4,4'-diamine].

According to the pixel structure of the second embodiment, since the red organic EL element 21R has the optical path length adjusting layer 827 between the inorganic hole injecting and transporting layer 826 and the red light emitting layer 823R, a light extraction efficiency can be optimized by the action of the optical path length adjusting layer 827. Then, by optimizing the light extraction efficiency, an organic EL device with higher efficiency can be obtained.

Manufacturing Method

Next, a method of manufacturing the organic EL display device having the pixel structure according to the second embodiment is described with reference to process diagrams in FIGS. 9A to 9C (part 1), process diagrams in FIGS. 10A and 10B (part 2), and process diagrams in FIGS. 11A and 11B (part 3).

Figure 9A:
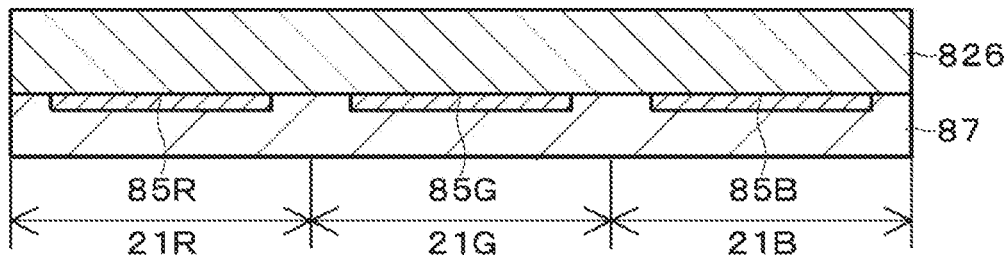
FIGS. 9A to 9C are process diagrams (No. 1) of a procedure of manufacturing the pixel structure according to the second embodiment.
Figure 9B:
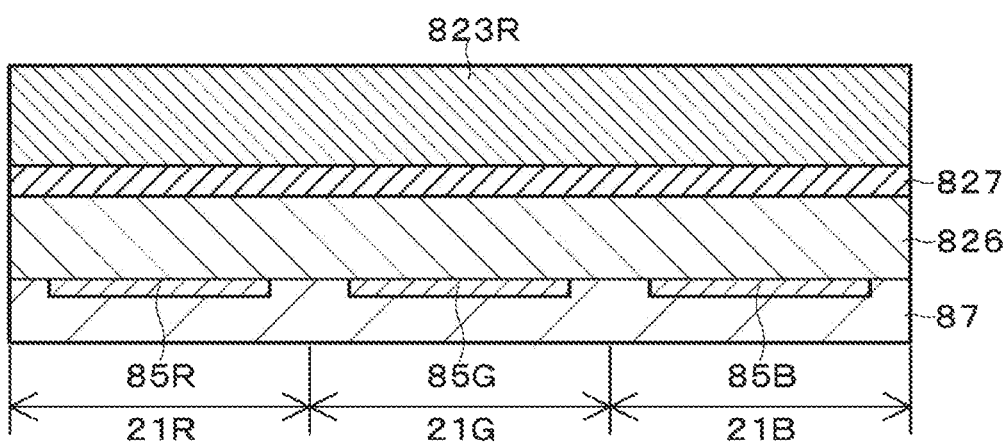
Figure 9C:
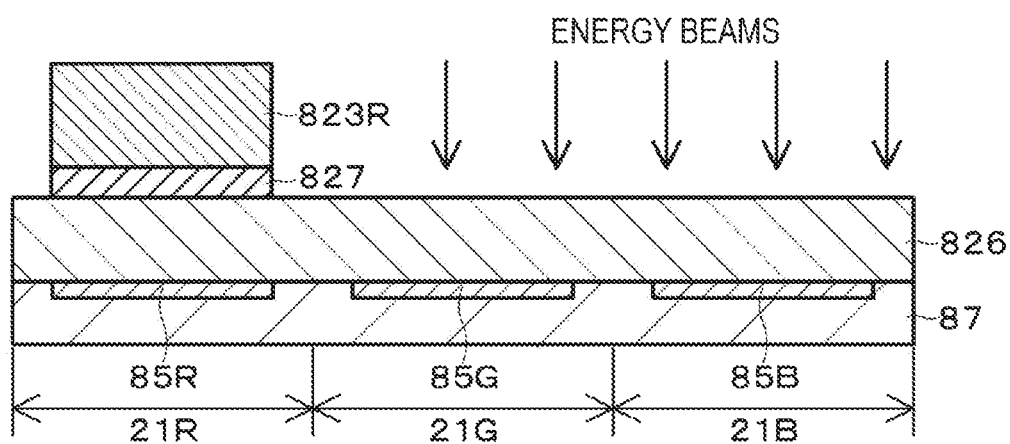

First, the inorganic hole injecting and transporting layer 826 made of the above-described materials is formed over the entire surface of the driving substrate by the sputtering method, for example (FIG. 9A). Next, the optical path length adjusting layer 827 and the red light emitting layer 823R are formed over the entire surface of the driving substrate by, for example, a line evaporation method (FIG. 9B). Next, the optical path length adjusting layer 827 and the red light emitting layer 823R on the inorganic hole injecting and transporting layer 826 in a green pixel region and a blue pixel region are removed by irradiating the energy beams, for example, argon ion beams (FIG. 9C).

Figure 10A:
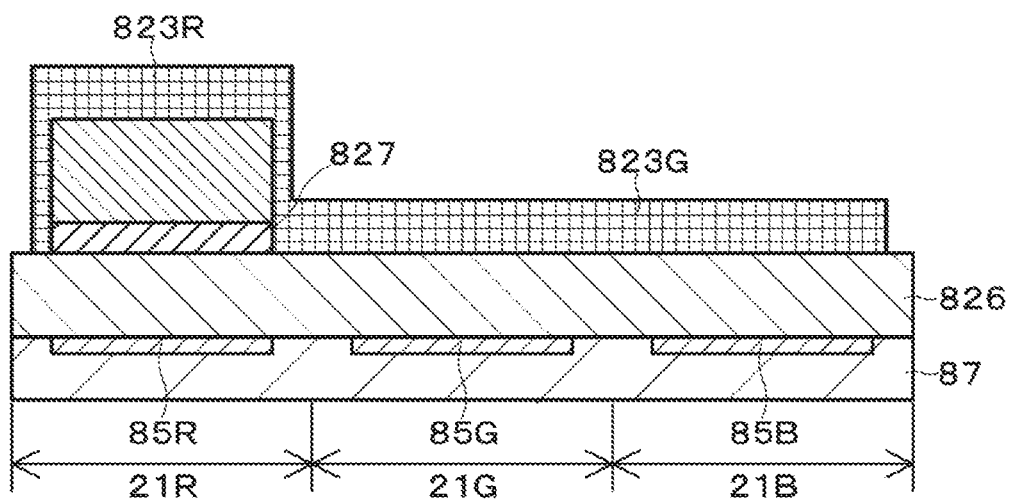
FIGS. 10A and 10B are process diagrams (No. 2) of the procedure of manufacturing the pixel structure according to the second embodiment.
Figure 10B:
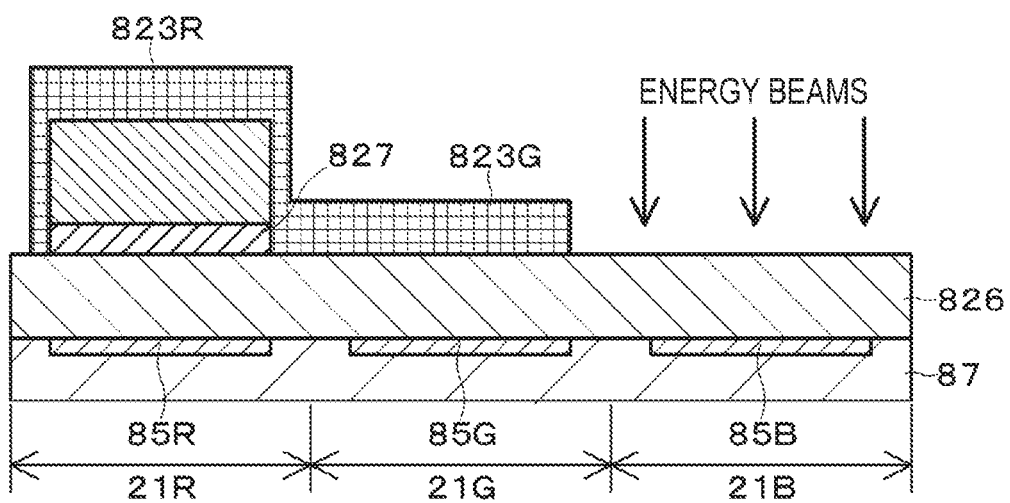
Figure 11A:
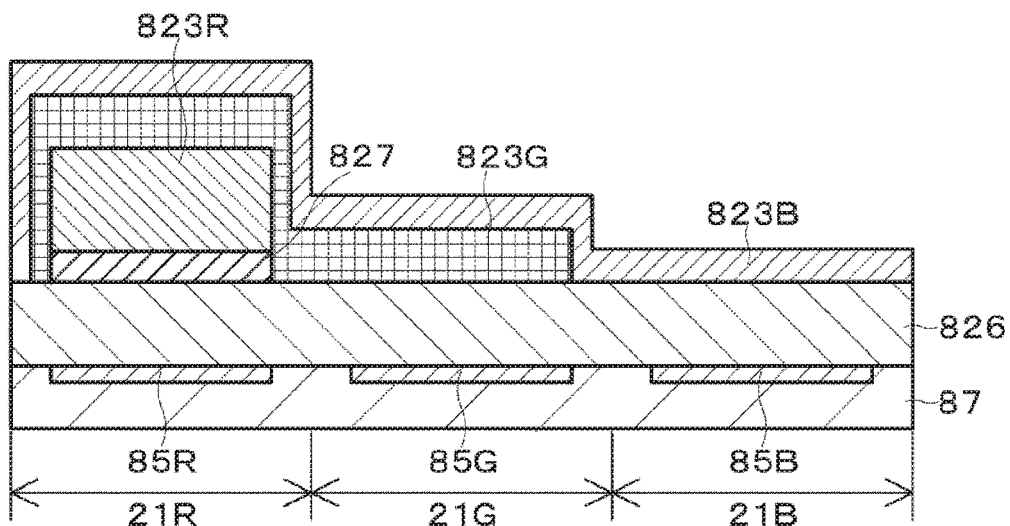
FIGS. 11A and 11B are process diagrams (No. 3) of the procedure of manufacturing the pixel structure according to the second embodiment.
Figure 11B:
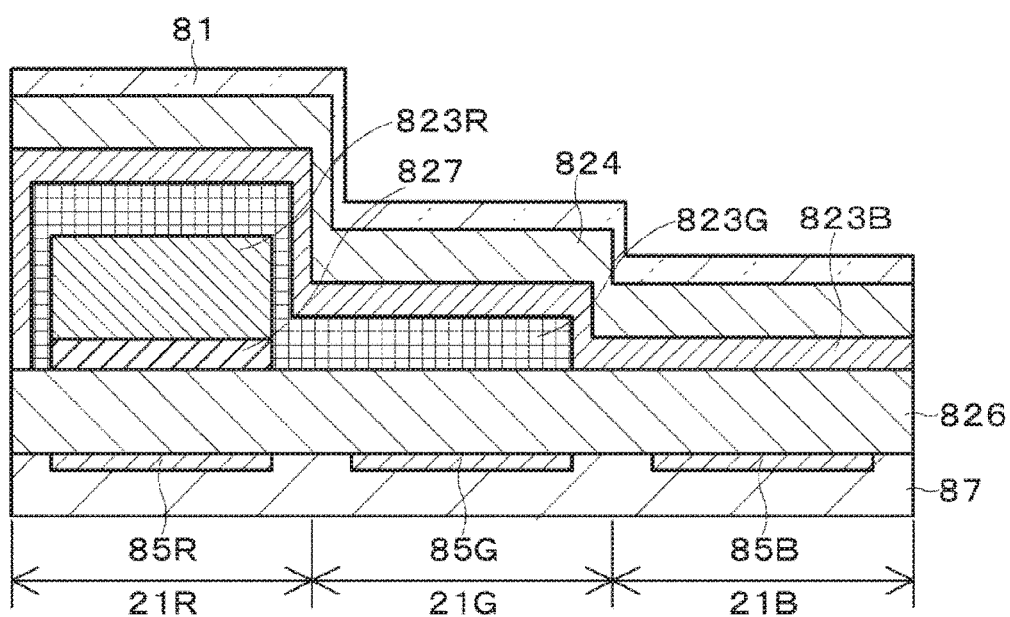

Subsequently, the green light emitting layer 823G is formed over the entire surface of the driving substrate by, for example, the line evaporation method (FIG. 10A). Next, the green light emitting layer 823G on the inorganic hole injecting and transporting layer 826 in the blue pixel region is removed by, for example, irradiating the argon ion beams (FIG. 10B). Next, the blue light emitting layer 823B is formed over the entire surface of the driving substrate by, for example, the line evaporation method (FIG. 11A). Subsequently, an electron transport layer 824 and a cathode electrode 81 are formed by, for example, a vapor deposition method (FIG. 11B).

Subsequently, a protective film 83 is formed to cover the entire surface of the formed cathode electrode 81, and after that, the driving substrate and the counter substrate are bonded together by using an adhesive resin. With the above series of processing, an organic EL display device 10 having the pixel structure according to the second embodiment is completed.

Third Embodiment

Figure 12:
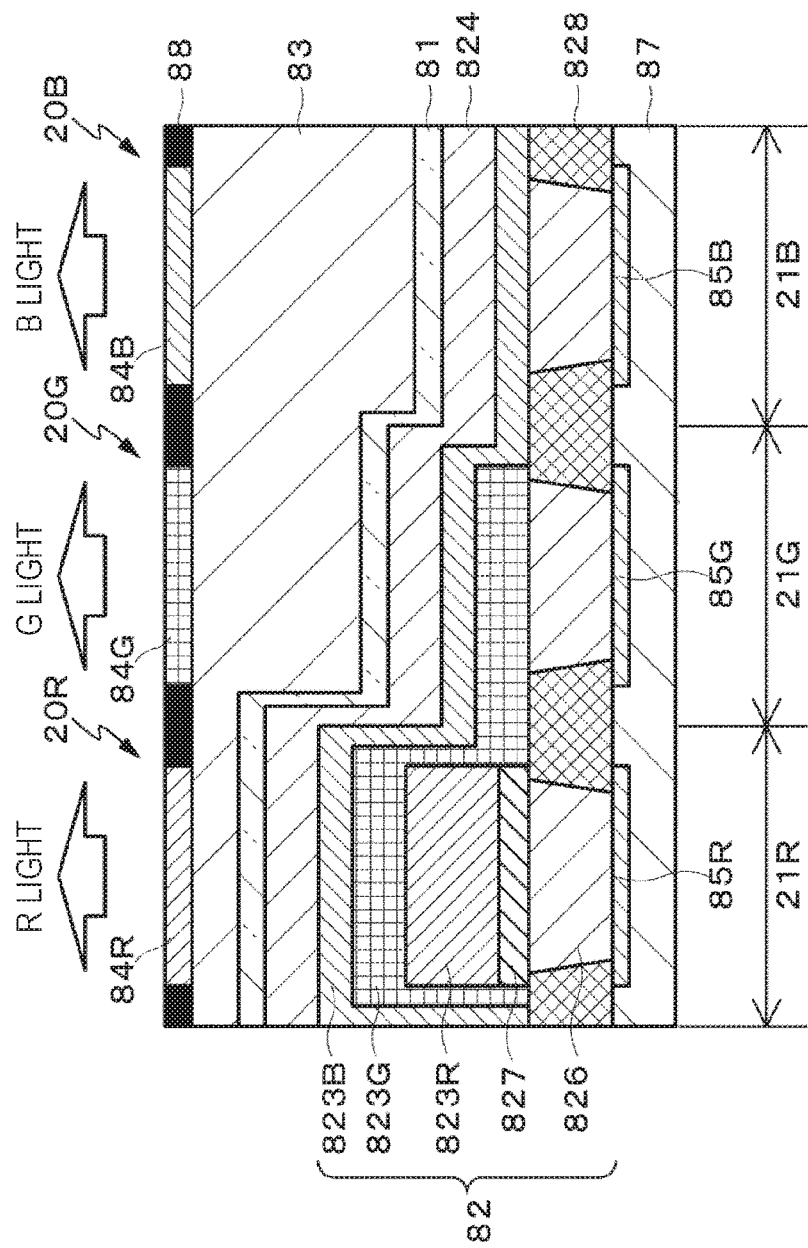
FIG. 12 is a cross-sectional diagram of a pixel structure of three R, G, and B sub-pixels having a resonator structure according to a third embodiment.

A third embodiment is a modification of the second embodiment. FIG. 12 is a cross-sectional diagram of a pixel structure of three R, G, and B sub-pixels having a resonator structure according to the third embodiment.

As illustrated in FIG. 12, in the pixel structure according to the third embodiment, an inorganic hole injecting and transporting layer 826 is electrically isolated by a pixel (sub-pixel) unit by an inter-pixel insulating film 828. The structure other than that is configured similarly to the pixel structure according to the second embodiment. It is preferable that the inter-pixel insulating film 828 be formed to have the same height as the inorganic hole injecting and transporting layer 826. The "same height" here includes the strictly same heights and substantially same heights. Variations generated in designing or manufacturing can be allowed.

According to the pixel structure of the second embodiment, since the inorganic hole injecting and transporting layer 826 is electrically isolated by the inter-pixel insulating film 828, current leakage between pixels through the inorganic hole injecting and transporting layer 826 can be reduced. Furthermore, since the height of the inter-pixel insulating film 828 and the height of the inorganic hole injecting and transporting layer 826 are flush with each other, the film thickness of an organic layer 82 laminated thereon becomes uniform. This can prevent abnormal light emission caused by nonuniformity of the film thickness of the organic layer 82 which is generated when the organic layer 82 is evaporated on a stepped structure.

Manufacturing Method

Next, a method of manufacturing an organic EL display device having a pixel structure according to the third embodiment is described with reference to process diagrams in FIGS. 13A to 13C (part 1), process diagrams in FIGS. 14A and 14B (part 2), and process diagrams in FIGS. 15A and 15B (part 3).

Figure 13A:
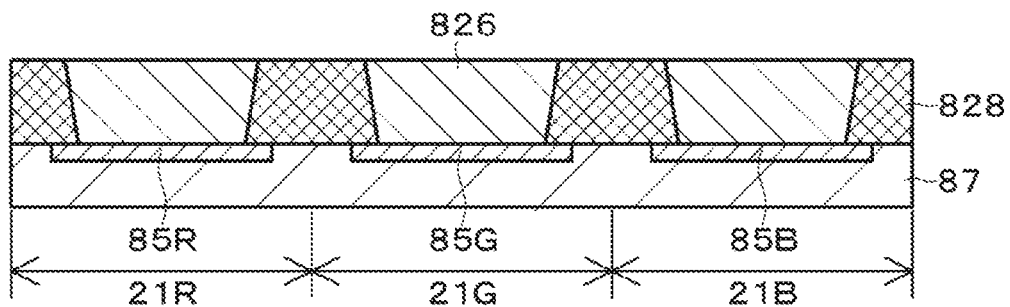
FIGS. 13A to 13C are process diagrams (No. 1) of a procedure of manufacturing the pixel structure according to the third embodiment.
Figure 13B:
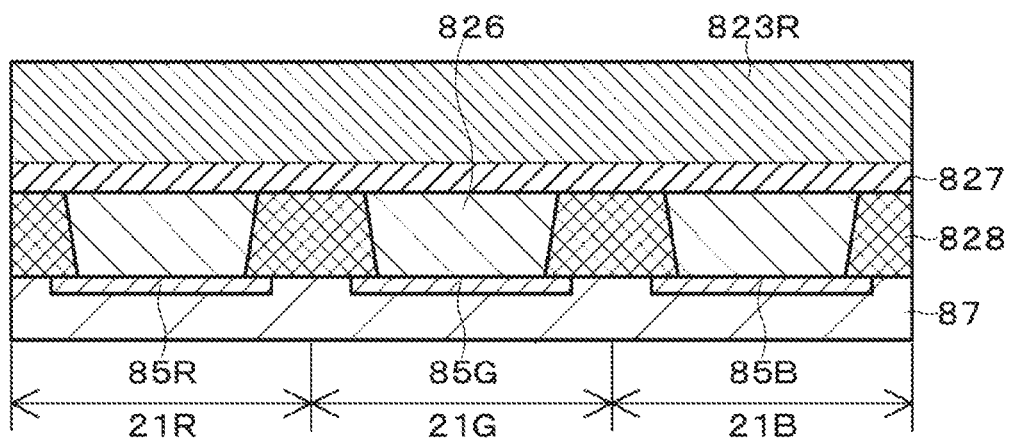
Figure 13C:
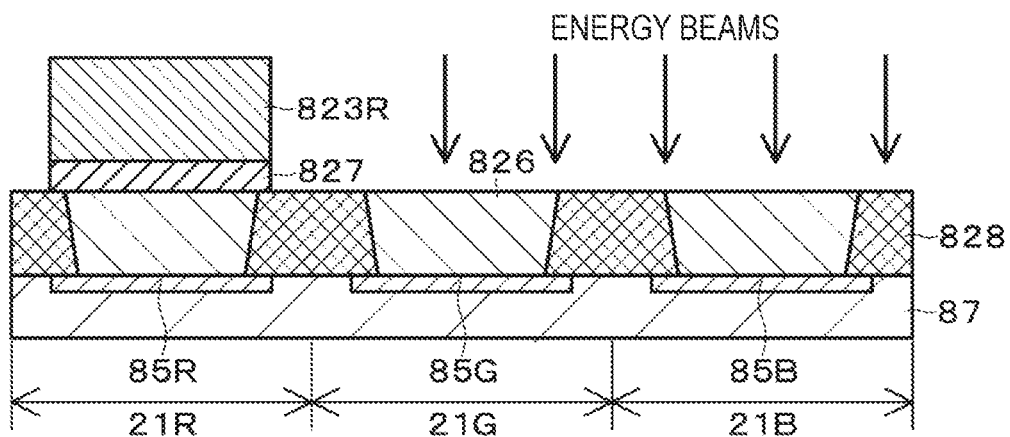

First, the inorganic hole injecting and transporting layer 826 is formed to cover the inter-pixel insulating film 828, and then, the height of the inter-pixel insulating film 828 and the height of the inorganic hole injecting and transporting layer 826 are uniformized by CMP and the like (FIG. 13A). Next, the optical path length adjusting layer 827 and the red light emitting layer 823R are formed over the entire surface of the driving substrate by, for example, a line evaporation method (FIG. 13B). Next, the optical path length adjusting layer 827 and the red light emitting layer 823R on the inorganic hole injecting and transporting layer 826 in the green pixel region and the blue pixel region are removed by irradiating the energy beams, for example, argon ion beams (FIG. 13C).

Figure 14A:
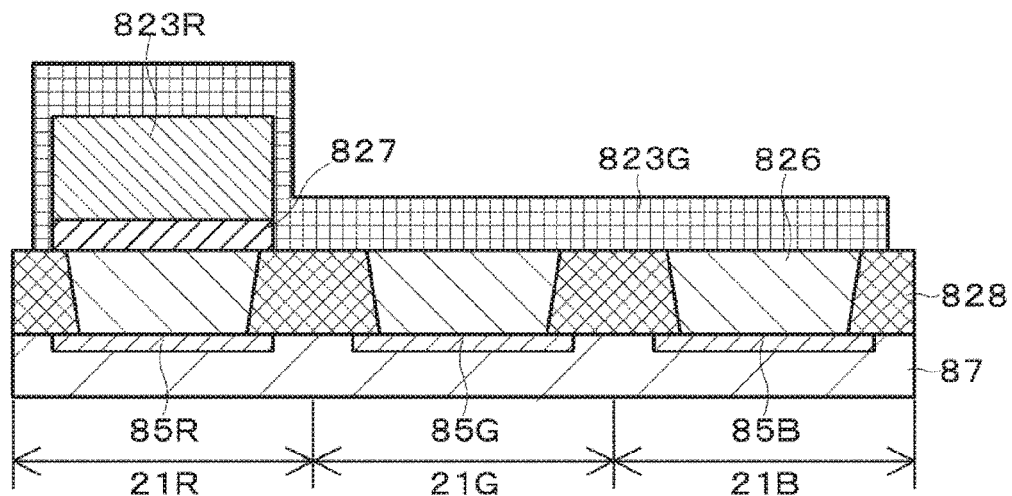
FIGS. 14A and 14B are process diagrams (No. 2) of the procedure of manufacturing the pixel structure according to the third embodiment.
Figure 14B:
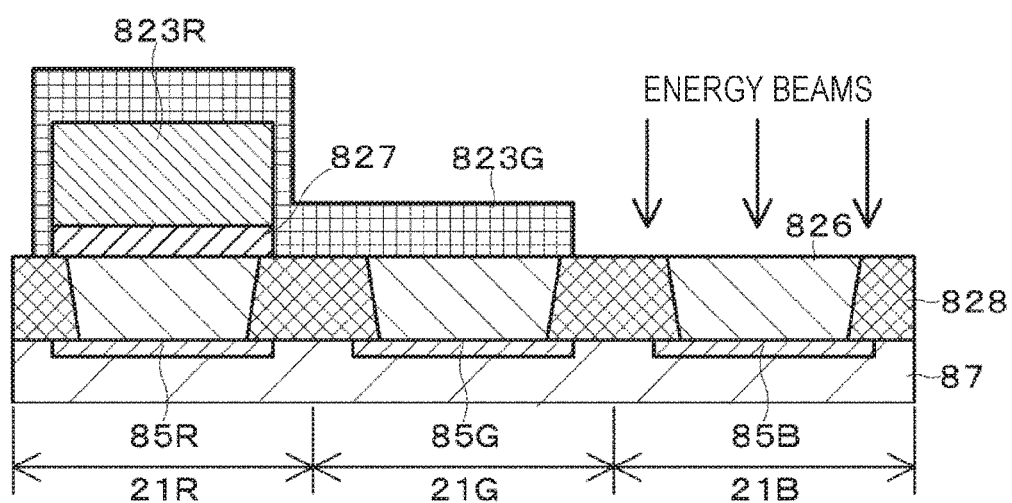
Figure 15A:
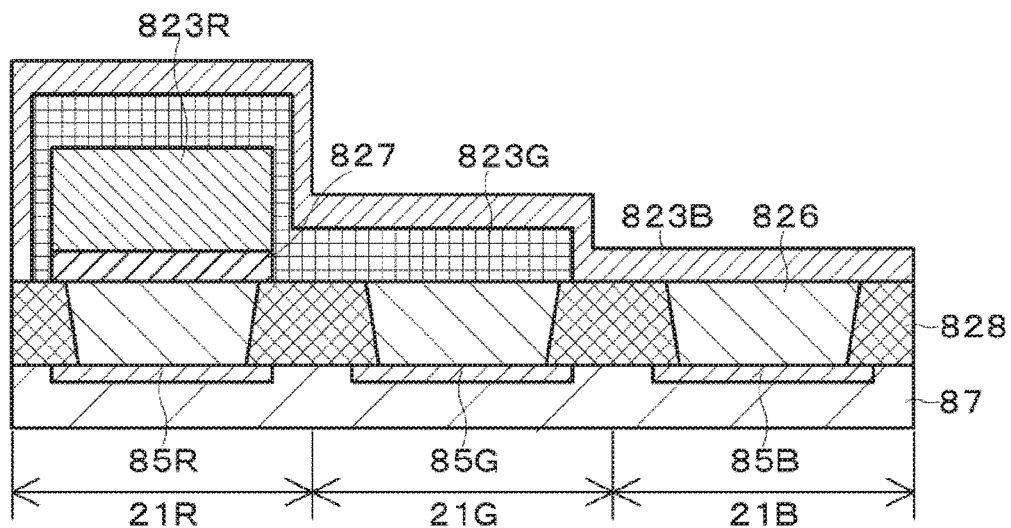
FIGS. 15A and 15B are process diagrams (No. 3) of the procedure of manufacturing the pixel structure according to the third embodiment.
Figure 15B:
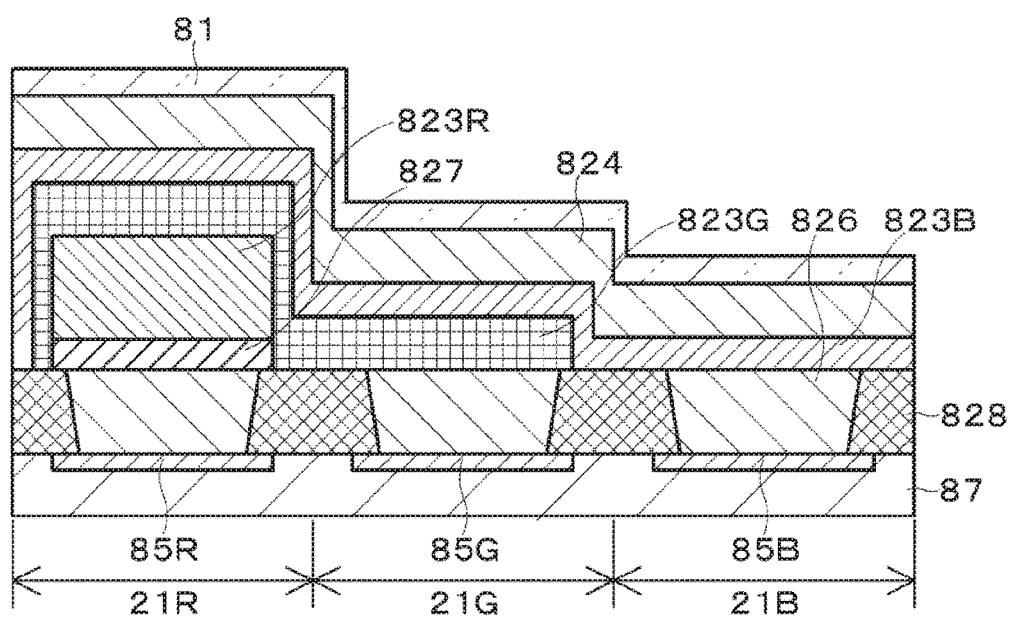

Subsequently, the green light emitting layer 823G is formed over the entire surface of the driving substrate by, for example, the line evaporation method (FIG. 14A). Next, the green light emitting layer 823G on the inorganic hole injecting and transporting layer 826 in the blue pixel region is removed by, for example, irradiating the argon ion beams (FIG. 14B). Next, the blue light emitting layer 823B is formed over the entire surface of the driving substrate by, for example, the line evaporation method (FIG. 15A). Subsequently, the electron transport layer 824 and the cathode electrode 81 are formed by, for example, a vapor deposition method (FIG. 15B).

Subsequently, the protective film 83 is formed to cover the entire surface of the formed cathode electrode 81, and after that, the driving substrate and the counter substrate are bonded together by using an adhesive resin. With the above series of processing, the organic EL display device having the pixel structure according to the third embodiment is completed.

Fourth Embodiment

Figure 16:
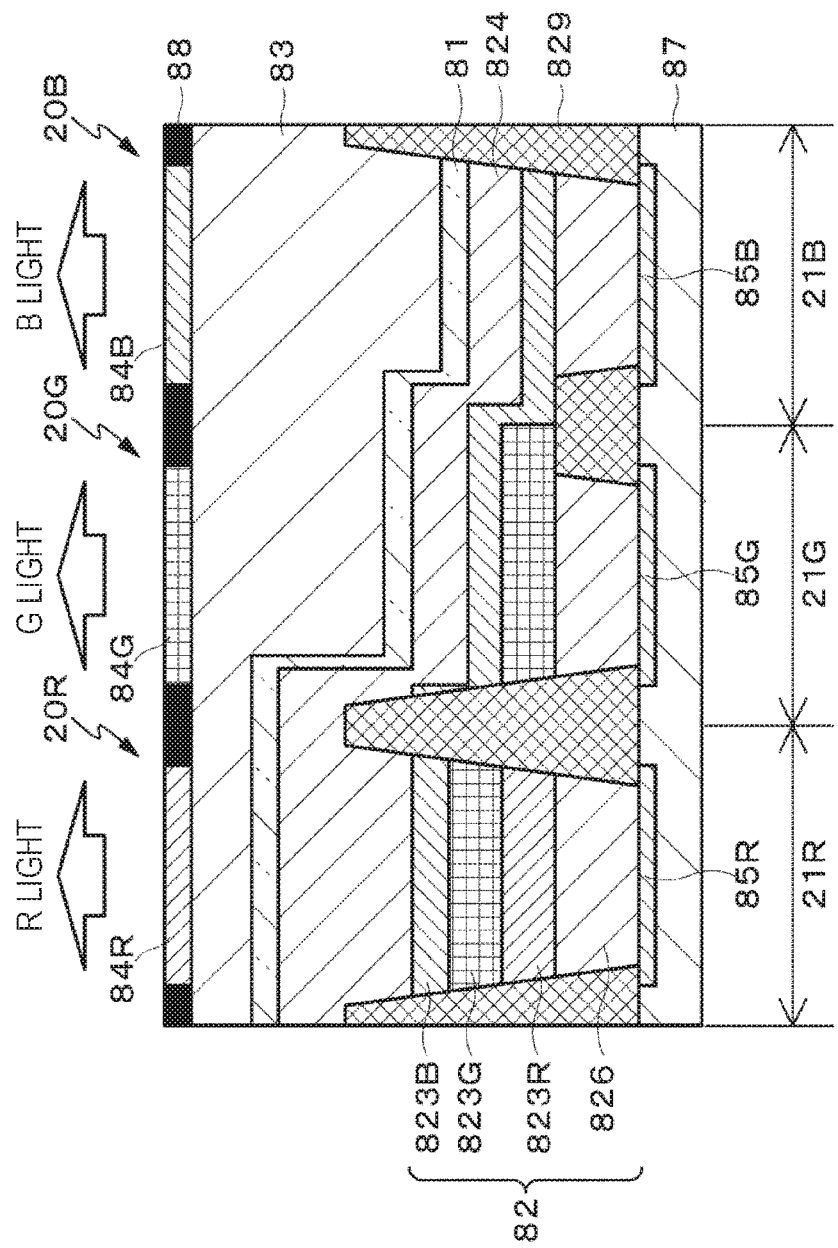
FIG. 16 is a cross-sectional diagram of a pixel structure of three R, G, and B sub-pixels having a resonator structure according to a fourth embodiment.

A fourth embodiment is another modification of the first embodiment. FIG. 16 is a cross-sectional diagram of a pixel structure of three R, G, and B sub-pixels having a resonator structure according to the fourth embodiment.

As illustrated in FIG. 16, in the pixel structure according to the fourth embodiment, partition walls 829 are provided at both ends of a red organic EL element 21R. The structure other than that is configured similarly to the pixel structure according to the second embodiment.

According to the pixel structure of the fourth embodiment, since the partition walls 829 are provided at both ends of the red organic EL element 21R, energy beams can be locally irradiated. Specifically, by obliquely irradiating the surface of an inorganic hole injecting and transporting layer 826 with the energy beams, a part of the organic EL elements 21G and 21B is shielded by the partition walls 829. Thus, it is possible to prevent removal of a green light emitting layer 823G and a blue green light emitting layer 823B to be left. Therefore, it becomes easy to locally irradiate the energy beams by the partition walls 829, and an organic film 82 can be selectively removed by self-alignment. As a result, the organic film 82 can be collectively removed. Therefore, productivity can be improved.

Manufacturing Method

Next, a method of manufacturing an organic EL display device having the pixel structure according to the fourth embodiment is described with reference to process diagrams in FIGS. 17A to 17C (part 1), process diagrams in FIGS. 18A and 18B (part 2), and process diagrams in FIGS. 19A and 19B (part 3).

Figure 17A:
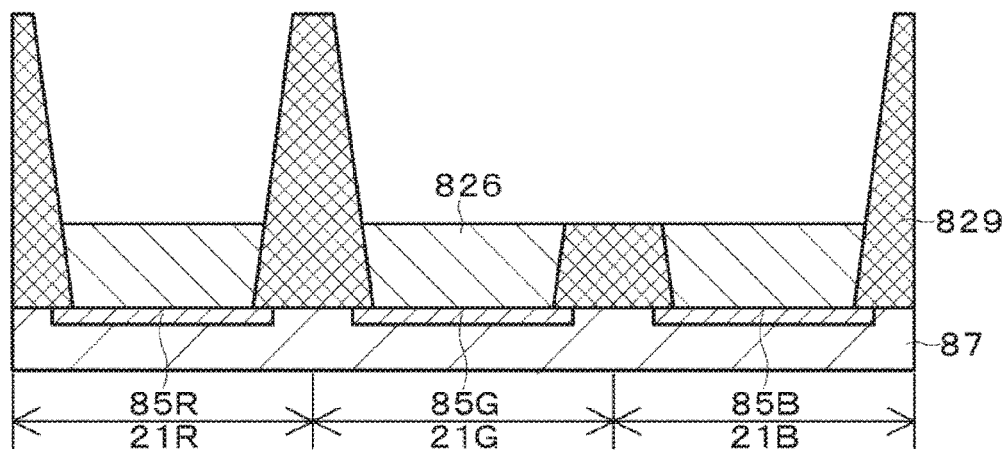
FIGS. 17A to 17C are process diagrams (No. 1) of a procedure of manufacturing the pixel structure according to the fourth embodiment.
Figure 17B:
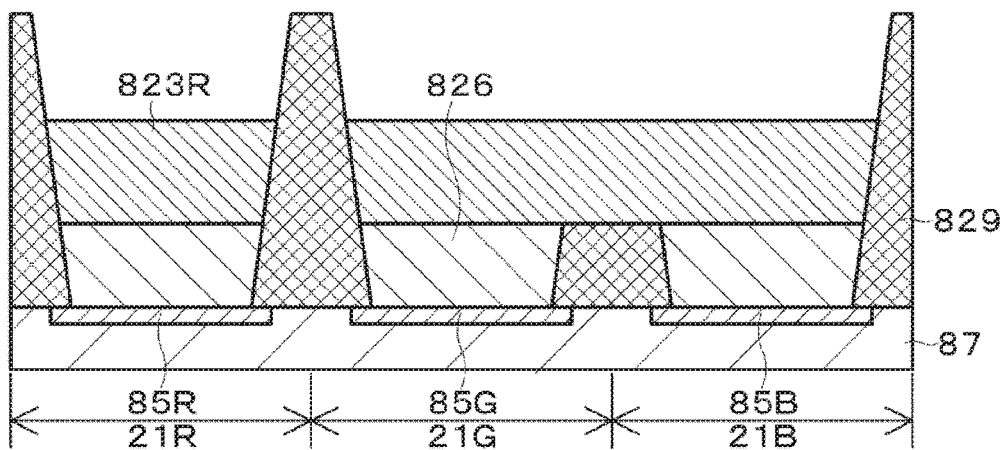
Figure 17C:
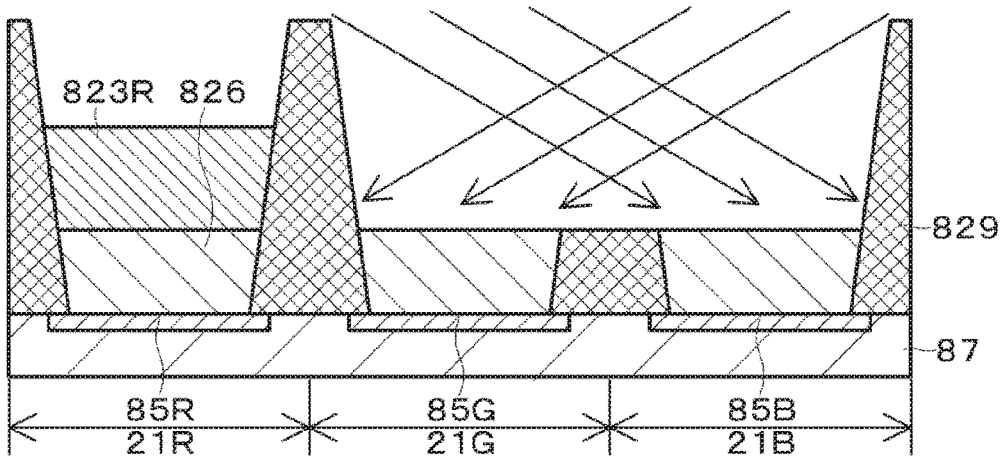

First, the partition walls 829 are formed at both ends of the red organic EL element 21R by using the method similar to that of the inter-pixel insulating film 828 of the third embodiment, and then, the inorganic hole injecting and transporting layer 826 is formed by, for example, sputtering (FIG. 17A). Next, the red light emitting layer 823R is formed over the entire surface of the driving substrate by, for example, a line evaporation method (FIG. 17B). Subsequently, the red light emitting layer 823R on the inorganic hole injecting and transporting layer 826 in the green pixel region and the blue pixel region is removed by obliquely irradiating the surface of the inorganic hole injecting and transporting layer 826 with, for example, argon ion beams. In addition, the red light emitting layer 823R on the inorganic hole injecting and transporting layer 826 in the blue pixel region is removed by obliquely irradiating the surface with the argon ion beams from the opposite direction (FIG. 17C).

Figure 18A:
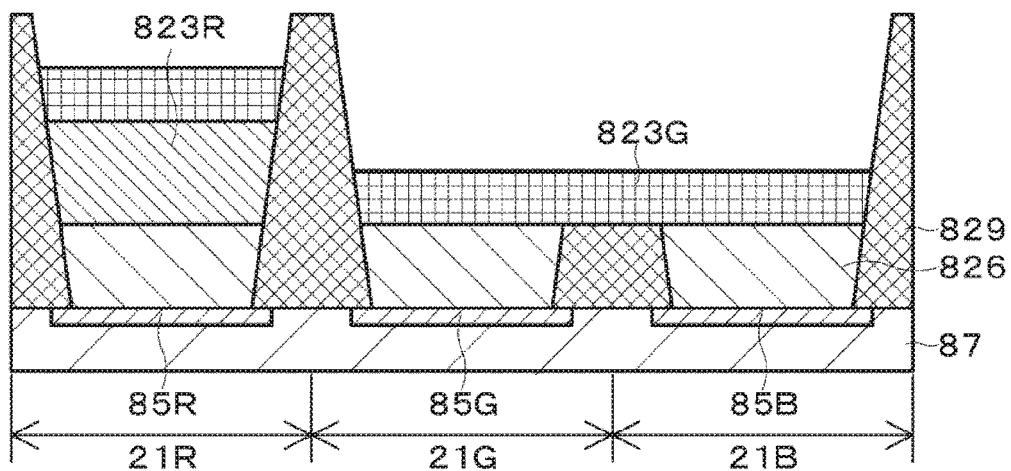
FIGS. 18A and 18B are process diagrams (No. 2) of the procedure of manufacturing the pixel structure according to the fourth embodiment.
Figure 18B:
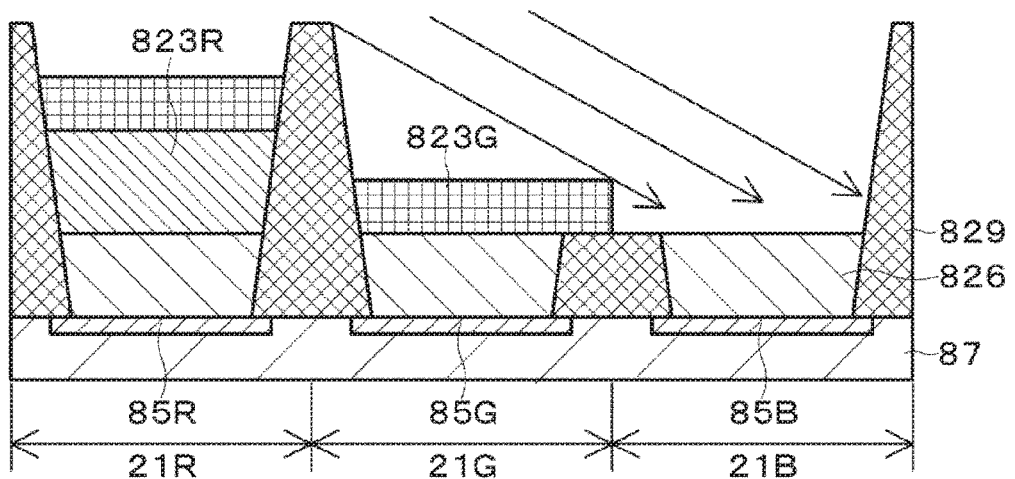
Figure 19A:
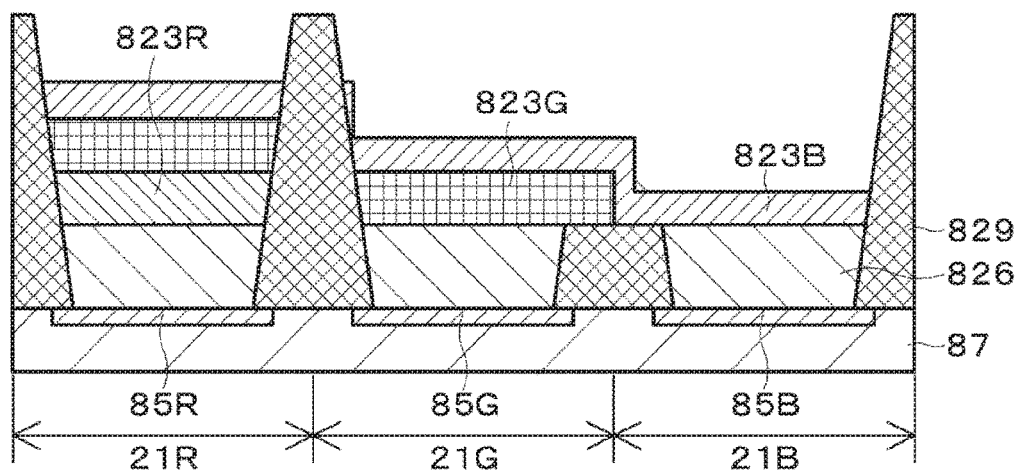
FIGS. 19A and 19B are process diagrams (No. 3) of the procedure of manufacturing the pixel structure according to the fourth embodiment.
Figure 19B:
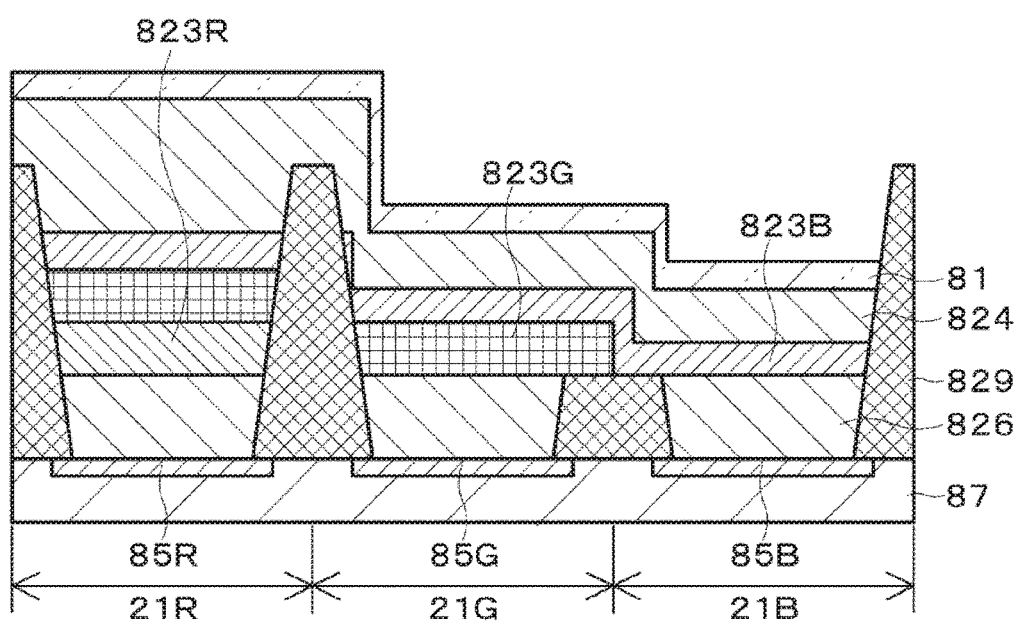

Subsequently, the green light emitting layer 823G is formed over the entire surface of the driving substrate by, for example, the line evaporation method (FIG. 18A). Next, the green light emitting layer 823G on the inorganic hole injecting and transporting layer 826 in the blue pixel region is removed by, for example, irradiating the argon ion beams from an oblique direction (FIG. 18B). Next, the blue light emitting layer 823B is formed over the entire surface of the driving substrate by, for example, the line evaporation method (FIG. 19A). Subsequently, the electron transport layer 824 and the cathode electrode 81 are formed by, for example, a vapor deposition method (FIG. 19B).

Subsequently, the protective film 83 is formed to cover the entire surface of the formed cathode electrode 81, and after that, the driving substrate and the counter substrate are bonded together by using an adhesive resin. With the above series of processing, an organic EL display device 10 having the pixel structure according to the fourth embodiment is completed.

Furthermore, in the fourth embodiment, the partition walls 829 are provided at both ends of the red organic EL element 21R with respect to the pixel structure according to the first embodiment. However, a configuration can be employed in which the partition walls 829 are provided at both ends of the red organic EL element 21R with respect to the pixel structure according to the second embodiment.

Electronic Device

The display device according to the present disclosure described above is used as a display unit (display device) of electronic devices in all fields displaying video signals input to electronic devices or video signals generated in electronic devices as an image or a video. For example, the display device can be used as a display unit of a television set, a digital still camera, a laptop personal computer, a mobile terminal device such as a mobile phone, a video camera, and a head mounted display.

In this way, the following effects can be obtained by using the display device according to the present disclosure as the display unit in the electronic devices of various fields. That is, according to the technology of the present disclosure, the optical path length of the resonator structure can be optimized for each luminescent color, and variation in the optical path lengths of the resonator structure of the luminescent colors can be reduced. Therefore, the variations in the color and the luminous efficiency can be reduced, and accordingly, this contributes to improve a display quality.

The display device according to the present disclosure includes a device having a sealed module shape. As an example, a display module formed by bonding a counter part such as transparent glass to a pixel array unit can be used as the display device. Furthermore, the display module may include a circuit unit to input and output a signal and the like from outside to the pixel array unit and a flexible printed circuit (FPC). A digital still camera and a head mounted display are described as specific examples of the electronic device using the display device according to the present disclosure. However, the specific examples here are only exemplary, and the present disclosure is not limited to the examples.

Specific Example 1

Figure 20A:
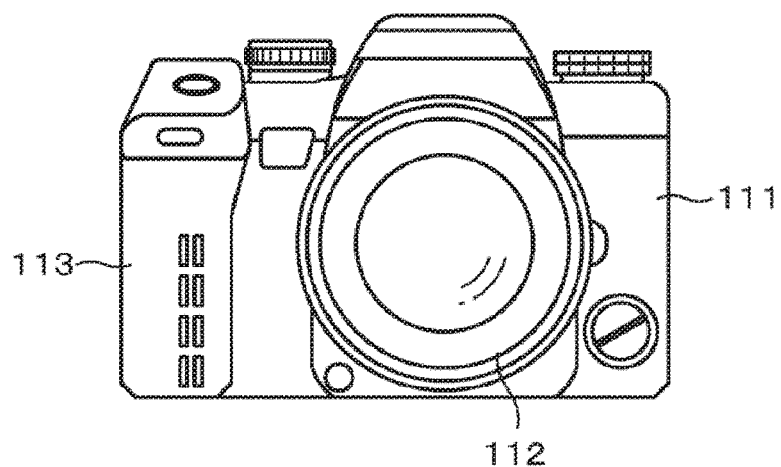
FIGS. 20A and 20B are external views of a lens interchangeable single lens reflex type digital still camera.
Figure 20B:
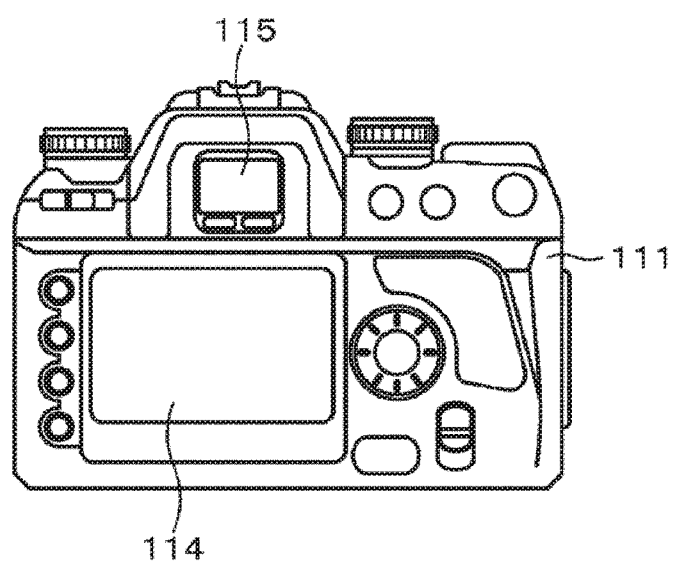

FIGS. 20A and 20B are external views of a lens interchangeable single lens reflex type digital still camera. FIG. 20A is a front view of the digital still camera, and FIG. 20B is a rear view. The lens interchangeable single lens reflex type digital still camera has, for example, an interchangeable type photographic lens unit (interchangeable lens) 112 on the front right side of a camera body 111 and a grip part 113 to be held by a photographer on the front left side.

Furthermore, a monitor 114 is provided substantially at the center of the rear surface of the camera body 111. A view finder (eyepiece window) 115 is provided on the upper part of the monitor 114. By looking through the view finder 115, a photographer can visually recognize an optical image of the subject guided from the photographic lens unit 112 and can determine a composition.

In the lens interchangeable single lens reflex type digital still camera having the above configuration, the display device according to the present disclosure can be used as the view finder 115. That is, the interchangeable lens single lens reflex type digital still camera according to this example is manufactured by using the display device according to the present disclosure as the view finder 115.

Specific Example 2

Figure 21:
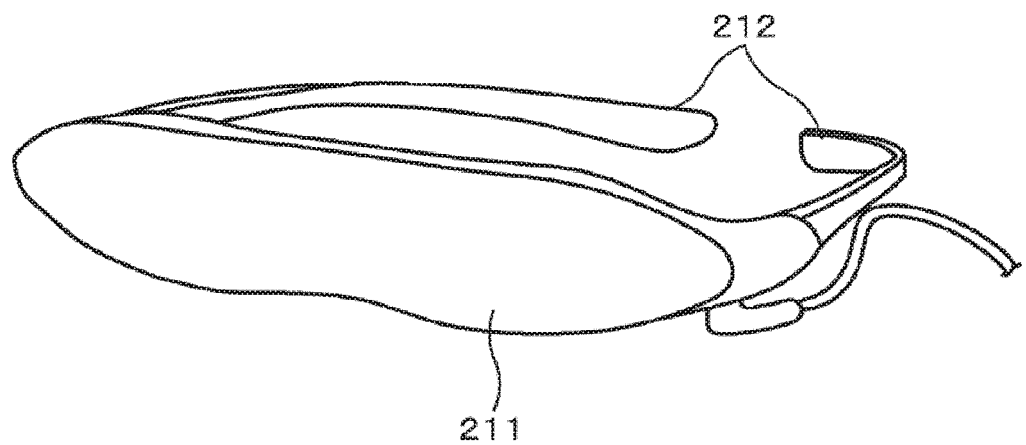
FIG. 21 is an external view of a head mount display.

FIG. 21 is an external view of a head mount display. For example, the head mount display has ear hooking parts 212 on both sides of a glass-shaped display part 211 for attaching the head mount display to the head of the user. In the head mounted display, the display device according to the present disclosure can be used as the display part 211. That is, the head mount display according to this example is manufactured by using the display device according to the present disclosure as the display part 211.

Note that the present disclosure can employ the following configuration.

[1] A display device including:
a first electrode;
an inorganic hole injecting and transporting layer configured to be formed of an inorganic material and be formed on the first electrode;
at least two light emitting units including a first organic light emitting unit and a second organic light emitting unit having different luminescent colors configured to be formed on the inorganic hole injecting and transporting layer;
an electron transport layer configured to be formed on the at least two organic light emitting units; and a second electrode configured to be formed on the electron transport layer, in which a light emitting layer of the first organic light emitting unit is formed by laminating a light emitting layer of a first luminescent color and a light emitting layer of a second luminescent color, and a light emitting layer of the second organic light emitting unit is formed of the light emitting layer of the second luminescent color.

[2] The display device according to [1], including:

three light emitting units that are a first organic light emitting unit, a second organic light emitting unit, and a third organic light emitting unit, in which the light emitting layer of the first organic light emitting unit is formed by laminating the light emitting layer of the first luminescent color, the light emitting layer of the second luminescent color, and a light emitting layer of the third luminescent color, the light emitting layer of the second organic light emitting unit is formed by laminating the light emitting layer of the second luminescent color and the light emitting layer of the third luminescent color, and the light emitting layer of the third organic light emitting unit is formed of the light emitting layer of the third luminescent color.

[3] The display device according to [1] or [2], in which the first organic light emitting unit includes an optical path length adjusting layer provided between the inorganic hole injecting and transporting layer and the light emitting layer of the first luminescent color.

[4] The display device according to any one of [1] to [3], in which in the inorganic hole injecting and transporting layer, an insulating film separates between the light emitting layer of the first luminescent color and the light emitting layer of the second luminescent color.

[5] The display device according to any one of [1] to [4], in which the first organic light emitting unit includes a partition wall provided between the first organic light emitting unit and an adjacent organic light emitting unit.

[6] A method of manufacturing a display device, including:

forming an inorganic hole injecting and transporting layer formed of an inorganic material on a first electrode;

forming at least two light emitting units including a first organic light emitting unit formed by laminating a light emitting layer of a first luminescent color and a light emitting layer of a second luminescent color and a second organic light emitting unit formed of the light emitting layer of the second luminescent color on the inorganic hole injecting and transporting layer;

forming an electron transport layer on the at least two organic light emitting units; and forming a second electrode on the electron transport layer, in which after the light emitting layer of the first luminescent color is formed on the inorganic hole injecting and transporting layer, the light emitting layer of the first luminescent color in a region of the second organic light emitting unit on the inorganic hole injecting and transporting layer is removed by irradiating energy beams, and then, the light emitting layer of the second luminescent color is formed in the region of the first organic light emitting unit and the region of the second organic light emitting unit.

[7] The method of manufacturing a display device according to [6], in which the energy beam is any one of a laser beam, an electron beam, a molecular beam, and an ion beam.

[8] The method of manufacturing a display device according to [6] or [7], in which the surface of the inorganic hole injecting and transporting layer is irradiated with the energy beams from an oblique direction.

[9] An electronic device including:

a display device configured to include:

a first electrode;

an inorganic hole injecting and transporting layer configured to be formed of an inorganic material and be formed on the first electrode;

at least two light emitting units including a first organic light emitting unit and a second organic light emitting unit having different luminescent colors configured to be formed on the inorganic hole injecting and transporting layer;

an electron transport layer configured to be formed on the at least two organic light emitting units; and a second electrode configured to be formed on the electron transport layer, in which a light emitting layer of the first organic light emitting unit is formed by laminating a light emitting layer of a first luminescent color and a light emitting layer of a second luminescent color, and a light emitting layer of the second organic light emitting unit is formed of the light emitting layer of the second luminescent color.

REFERENCE SIGNS LIST 10 organic EL display device
20 (20R, 20G, 20B) unit pixel (pixel/pixel circuit)
21 (21R, 21G, 21B) organic EL element
22 driving transistor
23 writing transistor
24 holding capacitor
25 auxiliary capacitor
30 pixel array unit
31 ($31_1$ to $31_m$) scanning line
32 ($32_1$ to $32_m$) power supply line
33 ($33_1$ to $33_n$) signal line
34 common power supply line
40 write scanning unit
50 power supply scanning unit
60 signal outputting unit
70 display panel
81 cathode electrode
82 organic layer
83 protective film
84R, 84G, 84B color filter
85R, 85G, 85B anode electrode
86R, 86G, 86B reflection plate
87 interlayer film
88 light shielding film (black matrix)
821 hole injection layer
822 hole transport layer
823R, 823B, 823G RBG light emitting layer
824 electron transport layer
825 intermediate layer
826 inorganic hole injecting and transporting layer
827 optical path length adjustment layer
828 inter-pixel insulating film
829 partition wall

The invention claimed is:

1. A display device comprising:
a first light emitting element that comprises:
an upper electrode between a first light emitting layer and a first color filter, only a first color of light is transmissible through the first color filter,
the first light emitting layer between the upper electrode and a first lower electrode, a first distance is from a bottom of the upper electrode to a top of the first lower electrode;
an inorganic hole injection and transporting layer between the first lower electrode and the first light emitting layer;
a second light emitting element that comprises:
the upper electrode between the first light emitting layer and a second color filter, only a second color of light is transmissible through the second color filter,
the first light emitting layer between the upper electrode and a second lower electrode, a second distance is from a bottom of the upper electrode to a top of the second lower electrode;
a third light emitting element that comprises:
the upper electrode between the first light emitting layer and a third color filter, only a third color of light is transmissible through the third color filter,
the first light emitting layer between the upper electrode and a third lower electrode, a third distance is from a bottom of the upper electrode to a top of the third lower electrode,
wherein:
an inter-pixel insulating film is between a first portion of the inorganic hole injection and transporting layer and a second portion of the inorganic hole injection and transporting layer,
the inter-pixel insulating film is of a same height as the inorganic hole injection and transporting layer,
wherein the first distance is shorter than the second distance, the second distance is shorter than the third distance.

2. The display device according to claim 1, wherein the first light emitting layer is configured to emit the first color of light.

3. The display device according to claim 1, further comprising:
an electron transport layer between the upper electrode and the first light emitting layer.

4. The display device according to claim 1, wherein the second light emitting element is between the first light emitting element and the third light emitting element.

5. The display device according to claim 1, wherein the first color of light is a color that is not the second color of light, the third color of light is a color that is neither the second color of light nor the first color of light.

6. The display device according to claim 1, further comprising:
a second light emitting layer configured to emit the second color of light.

7. The display device according to claim 6, wherein the second light emitting element further comprises the second light emitting layer between the second lower electrode and the first light emitting layer.

8. The display device according to claim 6, wherein the third light emitting element further comprises the second light emitting layer between the third lower electrode and the first light emitting layer.

9. The display device according to claim 6, further comprising:
a third light emitting layer configured to emit the third color of light.

10. The display device according to claim 9, wherein the third light emitting element further comprises the third light emitting layer between the third lower electrode and the second light emitting layer.

* * * * *